United States Patent
Na et al.

(10) Patent No.: US 10,193,193 B2
(45) Date of Patent: Jan. 29, 2019

(54) STRUCTURE OF BATTERY PROTECTION CIRCUIT MODULE PACKAGE COUPLED WITH HOLDER, AND BATTERY PACK HAVING SAME

(71) Applicant: ITM SEMICONDUCTOR CO., LTD., Chungcheongbuk-do (KR)

(72) Inventors: Hyeokhwi Na, Chungcheongbuk-do (KR); Hoseok Hwang, Gyeonggi-do (KR); Jongun Bach, Daegu (KR); Hyangwon Kang, Chungcheongbuk-do (KR); Seungyong Park, Chungcheongnam-do (KR); Sungho Song, Seoul (KR); Dawoon Jung, Gangwon-do (KR)

(73) Assignee: ITM SEMICONDUCTOR CO., LTD, Chungcheongbuk-Do (KR)

( * ) Notice: Subject to any disclaimer, the term of this patent is extended or adjusted under 35 U.S.C. 154(b) by 2 days.

(21) Appl. No.: 14/905,328

(22) PCT Filed: Jul. 18, 2014

(86) PCT No.: PCT/KR2014/006517
§ 371 (c)(1),
(2) Date: Jan. 15, 2016

(87) PCT Pub. No.: WO2015/009087
PCT Pub. Date: Jan. 22, 2015

(65) Prior Publication Data
US 2016/0164146 A1    Jun. 9, 2016

(30) Foreign Application Priority Data

Jul. 19, 2013 (KR) .................. 10-2013-0085168
Jul. 19, 2013 (KR) .................. 10-2013-0085169
(Continued)

(51) Int. Cl.
*H01M 10/42* (2006.01)
*H01M 2/04* (2006.01)
(Continued)

(52) U.S. Cl.
CPC .... *H01M 10/4257* (2013.01); *H01L 23/3107* (2013.01); *H01L 23/49541* (2013.01);
(Continued)

(58) Field of Classification Search
None
See application file for complete search history.

(56) References Cited

U.S. PATENT DOCUMENTS

| | | | |
|---|---|---|---|
| 2005/0122667 A1* | 6/2005 | Moon | H01M 2/30 361/600 |
| 2008/0226972 A1* | 9/2008 | Kwag | H01M 2/0207 429/121 |
| 2009/0123821 A1* | 5/2009 | Kim | H01M 2/0404 429/124 |

FOREIGN PATENT DOCUMENTS

| | | |
|---|---|---|
| CN | 101897054 A | 11/2010 |
| JP | 2007-280813 | 10/2007 |

(Continued)

OTHER PUBLICATIONS

Cho et al. (KR 20110071798, machine translation).*

*Primary Examiner* — Wojciech Haske
(74) *Attorney, Agent, or Firm* — Stuart H. Mayer; Mayer & Williams PC

(57) ABSTRACT

A battery pack includes a battery protection circuit module package coupled with a holder. The protection circuit module includes a basic package including a lead frame having a plurality of leads spaced apart from each other, and protection circuit elements provided on the lead frame, and an encapsulant and a holder simultaneously produced by disposing the basic package in a first injection mold and
(Continued)

injecting a resin melt into the first injection mold to perform an insert injection molding process. The encapsulant encapsulates the protection circuit elements to expose parts of the lead frame, wherein the encapsulant and the basic package configure the battery protection circuit module package, and wherein the holder is coupled to the battery protection circuit module package due to the insert injection molding process.

12 Claims, 15 Drawing Sheets

(30) Foreign Application Priority Data

| Jul. 19, 2013 | (KR) | ........................ 10-2013-0085170 |
| Aug. 30, 2013 | (KR) | ........................ 10-2013-0104415 |
| Aug. 30, 2013 | (KR) | ........................ 10-2013-0104417 |

(51) Int. Cl.

| H01M 2/30 | (2006.01) |
| H01L 23/31 | (2006.01) |
| H01L 23/495 | (2006.01) |
| H01L 23/00 | (2006.01) |
| H01L 27/06 | (2006.01) |
| H01M 2/02 | (2006.01) |
| H02J 7/00 | (2006.01) |

(52) U.S. Cl.
CPC ........ *H01L 23/49593* (2013.01); *H01L 24/48* (2013.01); *H01L 27/0629* (2013.01); *H01M 2/0469* (2013.01); *H01M 2/0473* (2013.01); *H01M 2/30* (2013.01); *H01M 10/425* (2013.01); *H01L 2224/45014* (2013.01); *H01L 2224/48245* (2013.01); *H01L 2224/48265* (2013.01); *H01L 2924/00014* (2013.01); *H01L 2924/12* (2013.01); *H01L 2924/1306* (2013.01); *H01L 2924/14* (2013.01); *H01L 2924/181* (2013.01); *H01L 2924/19105* (2013.01); *H01L 2924/19107* (2013.01); *H01M 2/0207* (2013.01); *H01M 2200/00* (2013.01); *H01M 2220/30* (2013.01); *H02J 7/0029* (2013.01)

(56) References Cited

FOREIGN PATENT DOCUMENTS

| KR | 1020090064089 | | 6/2009 | |
| KR | 1020090097599 | | 9/2009 | |
| KR | 1020100082531 | | 7/2010 | |
| KR | 20110071798 A | * | 6/2011 | ............ H01M 10/42 |
| KR | 2004662440000 | | 3/2013 | |
| KR | 101266509 | | 5/2013 | |

* cited by examiner (a)

(b)

(c)

STRUCTURE OF BATTERY PROTECTION CIRCUIT MODULE PACKAGE COUPLED WITH HOLDER, AND BATTERY PACK HAVING SAME

TECHNICAL FIELD

The present invention relates to a holder capable of mounting a battery protection circuit module package thereon, and a battery pack having the same and, more particularly, to a holder capable of mounting thereon a battery protection circuit module package configured to reduce a battery pack size, and a battery pack having the same.

BACKGROUND ART

A battery is generally used in mobile devices such as a mobile phone and a personal digital assistant (PDA). As a battery most commonly used in the mobile devices, a lithium ion battery is heated when overcharge or overcurrent occurs, and even has the risk of explosion as well as performance degradation if heating is continued and thus temperature thereof is increased. Accordingly, a typical battery may include a protection circuit device for detecting overcharge, overdischarge, and overcurrent and blocking operation of the battery. This conventional protection circuit device is generally produced by soldering a protection integrated circuit (IC), a field effect transistor (FET), resistors, capacitors, etc. on a printed circuit board (PCB). However, the conventional protection circuit device may not easily achieve a small size because the PCB occupies an excessively large space. Furthermore, after the protection circuit device is mounted on a battery core pack, a process for electrically connecting the same to external connection terminals or internal connection terminals through additional wires, wire bonding, or exposed terminals of the PCB is complicated and not easy.

DETAILED DESCRIPTION OF THE INVENTION

Technical Problem

The present invention provides a battery pack configured to easily achieve high integration and size reduction, and methods of manufacturing the same. However, the scope of the present invention is not limited thereto.

Technical Solution

According to an aspect of the present invention, there is provided a structure of a battery protection circuit module package coupled with a holder, the structure including a basic package including a lead frame consisting of a plurality of leads spaced apart from each other, and protection circuit elements provided on the lead frame, and an encapsulant and a holder simultaneously produced by disposing the basic package in a first injection mold and injecting a melt of resin into the first injection mold to perform an insert injection molding process, wherein the encapsulant encapsulates the protection circuit elements to expose parts of the lead frame, wherein the encapsulant and the basic package configure the battery protection circuit module package, and wherein the holder is coupled to the battery protection circuit module package by the insert injection molding process.

According to another aspect of the present invention, there is provided a structure of a battery protection circuit module package coupled with a holder. The battery protection circuit module package includes a lead frame consisting of a plurality of leads spaced apart from each other, protection circuit elements provided on the lead frame, and an encapsulant for encapsulating the protection circuit elements, and the holder is coupled to the battery protection circuit module package by disposing the battery protection circuit module package in a first injection mold and injecting a melt of resin to perform an insert injection molding process.

The lead frame may include a first internal connection terminal lead and a second internal connection terminal lead provided at two ends of the lead frame, exposed by the encapsulant, and electrically connectable to electrodes of a battery core pack, external connection terminal leads provided between the first and second internal connection terminal leads and serving as a plurality of external connection terminals, and element mounting leads provided between the first and second internal connection terminal leads and used to mount the protection circuit elements thereon.

The protection circuit elements may include a protection integrated chip (IC), a field effect transistor (FET), and one or more passive elements, and the passive elements may be provided to interconnect at least some of the leads spaced apart from each other, and may further include an electrical connection member for electrically interconnecting any two selected from the group consisting of the protection IC, the FET, and the leads, thereby configuring a battery protection circuit without using a printed circuit board (PCB). The electrical connection member may include bonding wire or bonding ribbon.

The protection IC and the FET may not be inserted and fixed into the lead frame in a form of a semiconductor package but may be mounted and fixed onto at least parts of a surface of the lead frame using surface mounting technology in a form of a chip die not encapsulated with an encapsulant.

The holder may include a body formed of the resin, and one or more through holes provided in the body, and parts of the battery protection circuit module package may be capable of being coupled and electrically connected to electrodes of a battery core pack through the through holes.

The holder may further include a fixing plate formed of metal and having one end buried and fixed by the body and another end protruding and extending from the body to be coupled and fixed to a top surface of the battery core pack.

The structure may be coupled to the battery core pack using at least one selected from the group consisting of laser welding, resistance welding, soldering, a conductive adhesive, and conductive tape.

According to another aspect of the present invention, there is provided a battery pack including the above-described structure, a battery core pack coupled with the structure, and an upper case produced to be coupled to at least a part of one selected among the structure and the battery core pack, by disposing the structure and the battery core pack in a second injection mold and injecting a melt of resin into the second injection mold to perform an insert injection molding process.

According to another aspect of the present invention, there is provided a method of manufacturing a structure of a battery protection circuit module package coupled with a holder, the method including providing a basic package including a lead frame consisting of a plurality of leads spaced apart from each other, and protection circuit elements provided on the lead frame, and simultaneously producing an encapsulant and a holder by disposing the basic package in a first injection mold and injecting a melt of resin into the first injection mold to perform an insert injection molding process, wherein the encapsulant encapsulates the protection circuit elements to expose parts of the lead frame, wherein the encapsulant and the basic package configure the battery protection circuit module package, and wherein the holder is coupled to the battery protection circuit module package due to the insert injection molding process.

According to another aspect of the present invention, there is provided a method of manufacturing a structure of a battery protection circuit module package coupled with a holder, the method including providing the battery protection circuit module package including a lead frame consisting of a plurality of leads spaced apart from each other, protection circuit elements provided on the lead frame, and an encapsulant for encapsulating the protection circuit elements, and producing the holder coupled to the battery protection circuit module package by disposing the battery protection circuit module package in a first injection mold and injecting a melt of resin to perform an insert injection molding process.

The simultaneously producing of the encapsulant and the holder may include producing the holder including a body for burying and fixing a part of a fixing plate, by further disposing the fixing plate formed of metal, in the first injection mold and injecting the melt of the resin to perform the insert injection molding process.

According to another aspect of the present invention, there is provided a method of manufacturing a battery pack, the method including providing the above-described structure, coupling the structure to a battery core pack, disposing the battery core pack coupled with the structure in a second injection mold, and producing an upper case coupled to at least a part of one selected among the structure and the battery core pack, by injecting a melt of resin into the second injection mold to perform an insert injection molding process.

According to another aspect of the present invention, there is provided a battery pack including a structure of a battery protection circuit module package coupled with a holder, the structure including a basic package including a lead frame consisting of a plurality of leads spaced apart from each other, and protection circuit elements provided on the lead frame, and an encapsulant and a holder simultaneously produced by disposing the basic package in a first injection mold and injecting a melt of resin into the first injection mold to perform an insert injection molding process, a battery core pack coupled with the structure, and an upper case for casing an upper part of the battery core pack to embed the structure therein, wherein the encapsulant encapsulates the protection circuit elements to expose parts of the lead frame, wherein the encapsulant and the basic package configure the battery protection circuit module package, and wherein the holder is coupled to the battery protection circuit module package due to the insert injection molding process.

According to another aspect of the present invention, there is provided a method of manufacturing a battery pack, the method including producing a structure of a battery protection circuit module package coupled with a holder, by providing a basic package including a lead frame consisting of a plurality of leads spaced apart from each other, and protection circuit elements provided on the lead frame, and simultaneously producing an encapsulant and a holder by disposing the basic package in a first injection mold and injecting a melt of resin into the first injection mold to perform an insert injection molding process, wherein the encapsulant encapsulates the protection circuit elements to expose parts of the lead frame, wherein the encapsulant and the basic package configure the battery protection circuit module package, and wherein the holder is coupled to the battery protection circuit module package due to the insert injection molding process, coupling the structure to a top surface of a battery core pack, and casing an upper part of the battery core pack with an upper case to embed the structure therein.

According to another aspect of the present invention, there is provided a battery pack including a structure of a battery protection circuit module package coupled with a holder, the structure including the battery protection circuit module package including a lead frame consisting of a plurality of leads spaced apart from each other, protection circuit elements provided on the lead frame, and an encapsulant for encapsulating the protection circuit elements, and the holder produced to be coupled to the battery protection circuit module package by disposing the battery protection circuit module package in a first injection mold and injecting a melt of resin to perform an insert injection molding process, a battery core pack coupled with the structure, and an upper case for casing an upper part of the battery core pack to embed the structure therein.

According to another aspect of the present invention, there is provided a method of manufacturing a battery pack, the method including providing a battery protection circuit module package including a lead frame consisting of a plurality of leads spaced apart from each other, protection circuit elements provided on the lead frame, and an encapsulant for encapsulating the protection circuit elements, producing a holder coupled to the battery protection circuit module package by disposing the battery protection circuit module package in a first injection mold and injecting a melt of resin to perform an insert injection molding process, thereby providing a structure of the battery protection circuit module package coupled with the holder, coupling the structure to a top surface of a battery core pack, and casing an upper part of the battery core pack with an upper case to embed the structure therein.

According to another aspect of the present invention, there is provided a holder capable of mounting a battery protection circuit module package thereon, the holder including a body made of resin and capable of supporting the battery protection circuit module package on a top surface of a battery core pack, and a fixing plate made of metal and having one end buried and fixed by the body and another end protruding and extending from the body to be coupled and fixed to the top surface of the battery core pack.

The one end of the fixing plate may be buried and fixed by the body produced by disposing the fixing plate in an injection mold and injecting a melt of the resin into the injection mold to perform an insert injection molding process.

The fixing plate may be bent in a form of a gull.

According to another aspect of the present invention, there is provided a method of manufacturing a holder capable of mounting a battery protection circuit module package thereon, the method including disposing a fixing plate formed of metal, in an injection mold, and burying and fixing one end of the fixing plate by injecting a melt of resin into the injection mold to perform an insert injection molding process, thereby producing a body capable of supporting the battery protection circuit module package.

According to another aspect of the present invention, there is provided a method of manufacturing a battery pack, the method including providing the above-described holder, fixing the holder to a battery core pack by coupling the fixing plate to a top surface of the battery core pack, and mounting the battery protection circuit module package on the holder.

Advantageous Effects

According to some embodiments of the present invention, a battery pack including a structure of a battery protection circuit module package coupled with a holder and configured to easily achieve high integration and size reduction of the battery pack, and a method of manufacturing the same may be provided. Furthermore, a manufacturing process may be simplified, a manufacturing cost may be reduced, a coupling force between parts may be increased, and thus the quality of the battery pack may be improved. However, the scope of the present invention is not limited to the above-described effects.

MODE OF THE INVENTION

Figure 1:
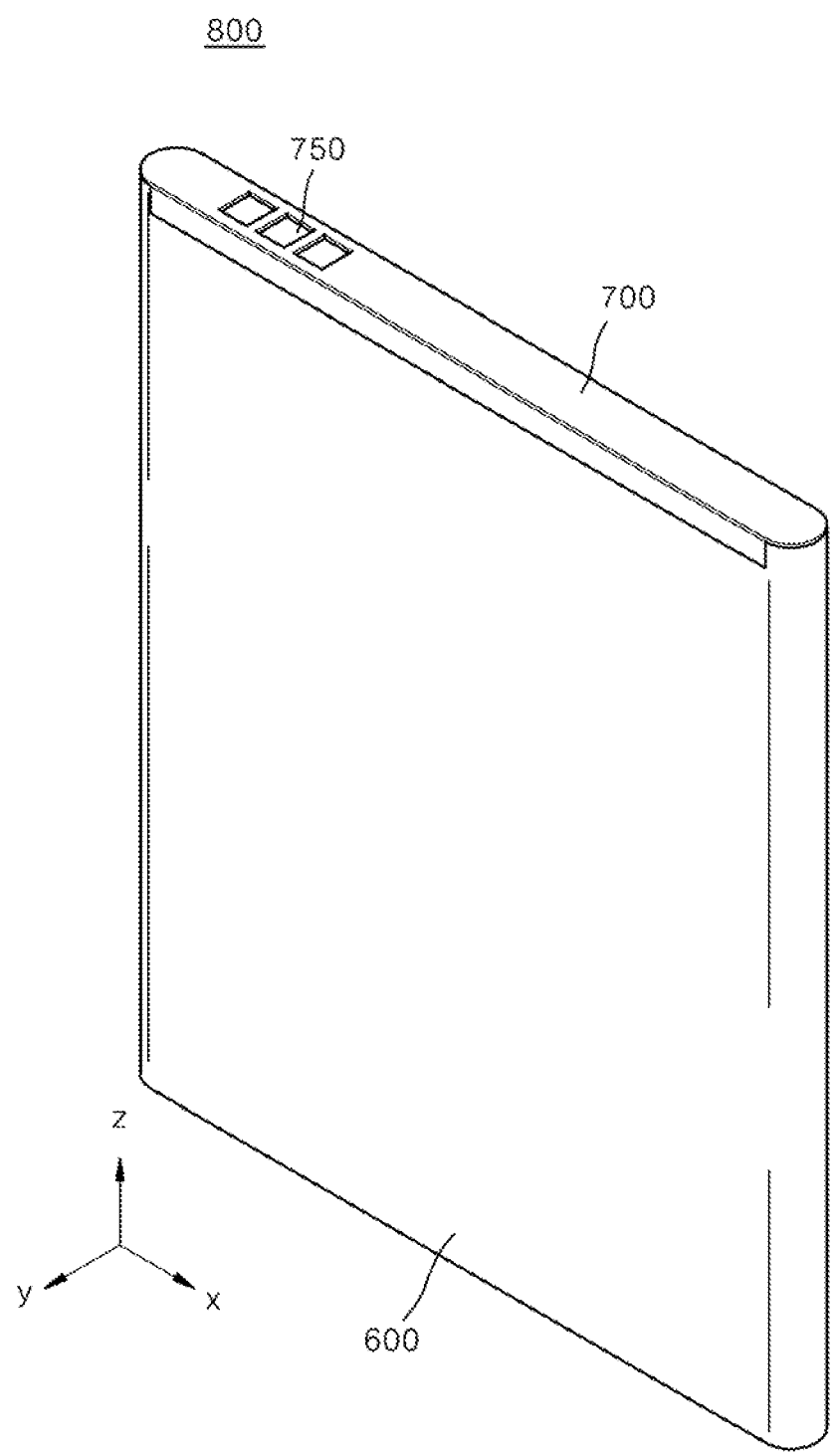
FIG. 1 is a perspective view of a battery pack according to some embodiments of the present invention.

Hereinafter, the present invention will be described in detail by explaining embodiments of the invention with reference to the attached drawings.

The invention may, however, be embodied in many different forms and should not be construed as being limited to the embodiments set forth herein; rather, these embodiments are provided so that this disclosure will be thorough and complete, and will fully convey the concept of the invention to one of ordinary skill in the art. In the drawings, the thicknesses of layers are exaggerated for clarity.

It will also be understood that when a layer is referred to as being "on" another layer or substrate, it can be directly on the other layer or substrate, or intervening layers may also be present. In the drawings, the thicknesses of layers and regions are exaggerated for clarity. Like reference numerals in the drawings denote like elements. As used herein, the term "and/or" refers to one of or a combination of at least two listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Spatially relative terms, such as "above," "upper," "beneath," "below," "lower," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "above" may encompass both an orientation of above and below. The device may be otherwise oriented (rotated 90 degrees or at other orientations) and the spatially relative descriptors used herein interpreted accordingly.

The terminology used herein is for the purpose of describing particular embodiments and is not intended to limit the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to schematic illustrations of idealized embodiments (and intermediate structures) of the invention. As such, variations from the shapes of the illustrations as a result, for example, of manufacturing techniques and/or tolerances, are to be expected. Thus, the embodiments of the invention should not be construed as limited to the particular shapes of regions illustrated herein, but are to include deviations in shapes that result, for example, from manufacturing.

In embodiments of the present invention, a lead frame is an element in which lead terminals are patterned on a metal frame, and may differ from a printed circuit board (PCB) in which a metal wiring layer is provided on an insulating core, in terms of structures or thicknesses thereof.

First Embodiment Group

Figure 2:
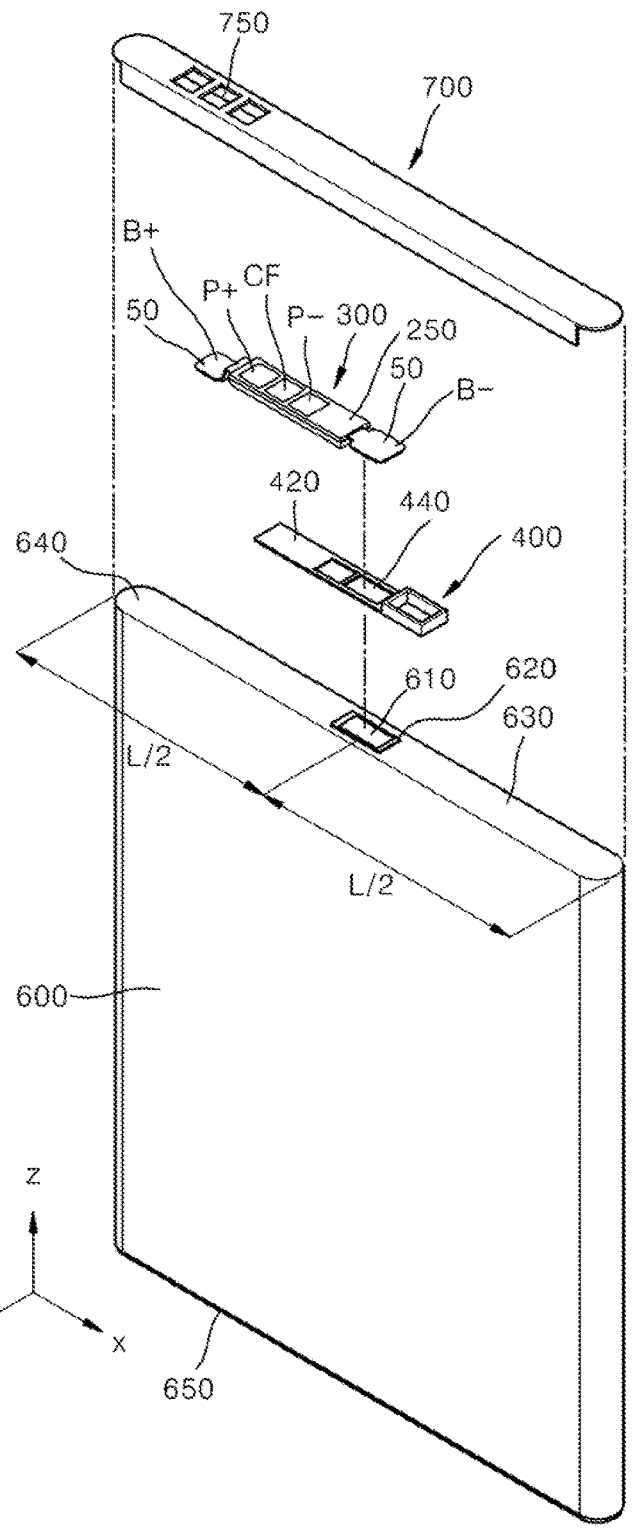
FIG. 2 is an exploded perspective view of the battery pack according to some embodiments of the present invention.

FIGS. 1 and 2 are assembled and exploded perspective views of a battery pack according to some embodiments of the present invention.

Referring to FIGS. 1 and 2, the battery pack 800 according to some embodiments of the present invention includes a battery core pack 600, a holder 400, a battery protection circuit module package 300, and an upper case 700. In addition, the battery pack 800 may further include a lower case (not shown) coupled to a bottom surface 650 of the battery core pack 600.

The battery core pack 600 may include one or more rechargeable/dischargeable unit cells. Herein, the unit cell may be a secondary battery, e.g., a lithium secondary battery. Alternatively, the unit cell may be a polymer-type secondary battery. A plurality of unit cells may be connected in serial or in parallel to each other to configure the battery core pack 600. The number or the connection method of the unit cells for configuring the battery core pack 600 is not limited to the above description and may be variously changed. The battery core pack 600 may supply power to a variety of electronic devices including mobile devices such as a mobile phone, a smartphone, a personal digital assistant (PDA), a smartpad, and a tablet computer.

The battery core pack 600 may be understood as a battery bare cell including an electrode assembly in which a positive plate and a negative plate are wound by intervening a separator therebetween, and a cap assembly for encapsulating the electrode assembly to expose a positive terminal and a negative terminal.

The electrode assembly may include, for example, a positive plate produced by coating a positive active material on a positive current collector, a negative plate produced by coating a negative active material on a negative current collector, and a separator intervened between the positive and negative plates to prevent a short circuit therebetween and allow lithium ions to move. A positive tap adhered to the positive plate and a negative tap adhered to the negative plate protrude from the electrode assembly.

The cap assembly includes a negative terminal 610, a gasket 620, and a cap plate 630. The cap plate 630 may serve as a positive terminal. The negative terminal 610 may also be called a negative cell or an electrode cell. The gasket 620 may be formed of an insulating material to insulate the negative terminal 610 and the cap plate 630 from each other. Accordingly, electrodes of the battery core pack 600 may include the negative terminal 610 and the cap plate 630. That is, the electrodes of the battery core pack 600 include the plate 630 having a first polarity (e.g., positive polarity) and the electrode cell 610 having a second polarity (e.g., negative polarity) and provided at the center of the plate 630.

The battery protection circuit module package 300 is mounted on a top surface 640 of the battery core pack 600 by intervening the holder 400 therebetween. The holder 400 includes a body 420 formed of resin and, optionally, may further include one or more through holes 440 provided in the body 420. The holder 400 may serve as a guide capable of accurately aligning and mounting the battery protection circuit module package 300 on the top surface 640 of the battery core pack 600, and may also serve as a fixer capable of firmly fixing the battery protection circuit module package 300 on the top surface 640 of the battery core pack 600. The shape or number of the body 420 or the through holes 440 included in the holder 400 may be appropriately changed to efficiently perform the above-described functions.

The battery protection circuit module package 300 may include a lead frame 50 consisting of a plurality of leads spaced apart from each other, protection circuit elements provided on the lead frame 50, and an encapsulant 250 for encapsulating the protection circuit elements. The encapsulant 250 partially exposes the lead frame 50. The encapsulant 250 may expose, for example, a first internal connection terminal lead B+ and a second internal connection terminal lead B− provided at two ends of the lead frame 50 and may further expose external connection terminal leads provided between the first and second internal connection terminal leads B+ and B− and serving as a plurality of external connection terminals P+, P−, and CF. In some embodiments of the present invention, the encapsulant 250 and the holder 400 may be simultaneously produced using a first insert injection molding process, and the encapsulant 250 and the holder 400 may be formed of the same resin. Due to the first insert injection molding process, the holder 400 may be coupled to the battery protection circuit module package 300. For example, the holder 400 may be coupled to and combined with the encapsulant 250 and/or the lead frame 50 due to the first insert injection molding process.

For convenience, the holder 400 and the battery protection circuit module package 300 are spaced apart from each other in FIG. 2. However, actually, a structure 500 (see FIG. 10) of the battery protection circuit module package 300 coupled with the holder 400 due to the first insert injection molding process is coupled to the top surface 640 of the battery core pack 600.

A part of the battery protection circuit module package 300 may be electrically connected to the electrodes of the battery core pack 600 through the through holes 440 of the holder 400. For example, the second internal connection terminal lead B− of the lead frame 50 of the battery protection circuit module package 300 may be electrically connected to the electrode cell 610 of the battery core pack 600 through the through holes 440 of the holder 400.

The upper case 700 cases an upper part of the battery core pack 600 to embed the structure 500 (see FIG. 10) therein. A preliminarily produced upper case 700 may be coupled to the upper part of the battery core pack 600 using a variety of coupling methods, e.g., assembling, welding, and/or an adhesive. In this case, the upper case 700 may be formed of at least one selected from the group consisting of resin, metal, ceramic, and a combination thereof.

Alternatively, unlike the above description, the upper case 700 may be produced by disposing the battery core pack 600 having the structure 500 (see FIG. 10) coupled to the top surface 640 thereof, in a second injection mold, and injecting a melt of resin into the second injection mold to perform a second insert injection molding process. The upper case 700 may be formed of the resin, and through holes 750 may be provided in parts thereof corresponding to the external connection terminals P+, CF, and P− of the lead frame 50 to expose the same.

Figure 3:
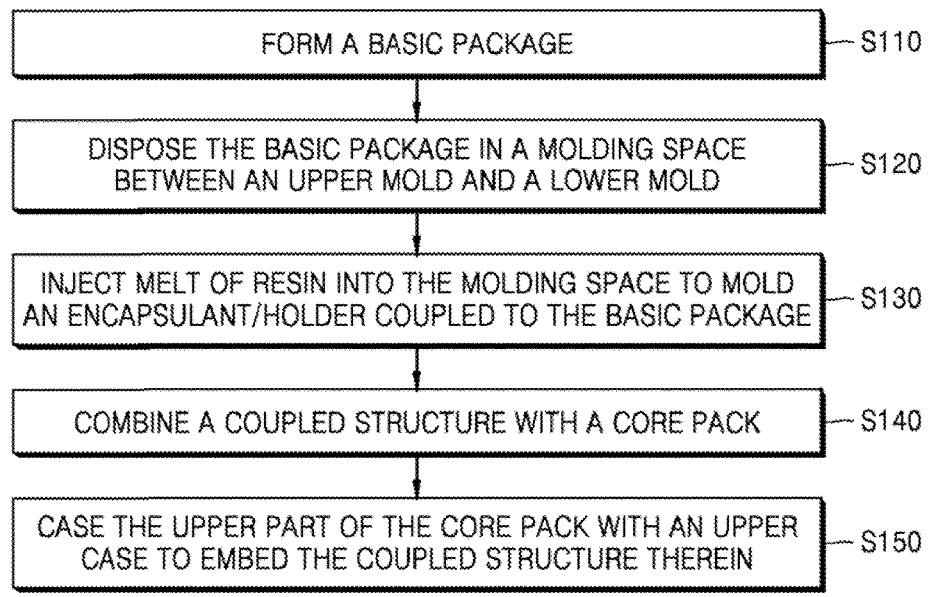
FIG. 3 is a flowchart of a method of manufacturing a battery pack, according to some embodiments of the present invention.

FIG. 3 is a flowchart of a method of manufacturing the battery pack according to some embodiments of the present invention.

Referring to FIG. 3, a method of manufacturing a structure of a battery protection circuit module package coupled with a holder includes providing a basic package including a lead frame consisting of a plurality of leads spaced apart from each other, and protection circuit elements provided on the lead frame (S110), disposing the basic package in a first injection mold (S120), and injecting a melt of resin into the first injection mold and performing an insert injection molding process to simultaneously produce an encapsulant and the holder (S130). As a result of performing operation S130, the structure of the battery protection circuit module package coupled with the holder is implemented. Subsequently, the method includes coupling a battery core pack with the structure (S140), and casing an upper part of the battery core pack with an upper case to embed the structure therein (S150).

As described above, the structure of the battery protection circuit module package coupled with the holder is implemented by sequentially performing operations S110, S120, and S130. A description is now given of the battery protection circuit module package.

Figure 4:
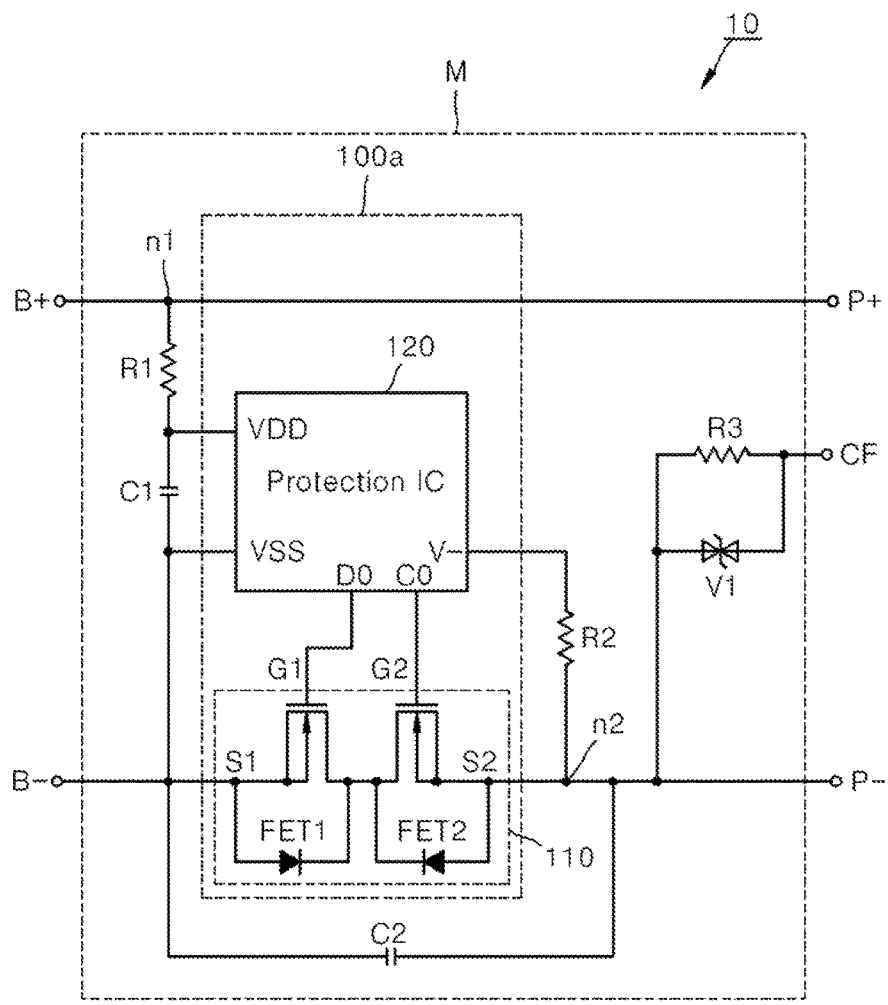
FIG. 4 is a circuit diagram of a battery protection circuit to be implemented by a battery protection circuit module package in the battery pack according to some embodiments of the present invention.

FIG. 4 is a circuit diagram of a battery protection circuit 10 to be implemented by a battery protection circuit module package in the battery pack according to some embodiments of the present invention. As illustrated in FIG. 4, the battery protection circuit 10 according to some embodiments of the present invention includes first and second internal connection terminals B+ and B− to be connected to a battery cell, and first to third external connection terminals P+, CF, and P− to be connected to a charger for charging and to be connected to an electronic device (e.g., a mobile device) operating by battery power, for discharging. Herein, among the first to third external connection terminals P+, CF, and P−, the first and third external connection terminals P+ and P− are used to supply power and the other second external connection terminal CF is used to detect a battery type and perform charging appropriately for the battery type. In addition, the second external connection terminal CF may be provided as a thermistor for detecting battery temperature when charging, has another function, and is used as a terminal.

The battery protection circuit 10 may have a connection structure of a dual field effect transistor (FET) chip 110, a protection integrated circuit (IC) 120, resistors R1, R2, and R3, a varistor V1, and capacitors C1 and C2. The dual FET chip 110 includes first and second field effect transistors FET1 and FET2 having a common drain. The protection IC 120 has a terminal (e.g., VDD) connected through the resistor R1 to the first internal connection terminal B+ serving as (+) terminal of the battery, applying a charge or discharge voltage through a first node n1, and detecting a battery voltage, a reference terminal (e.g., VSS) for providing a reference voltage of an internal operation voltage of the protection IC 120, a detection terminal (e.g., V−) for detecting charge/discharge and overcurrent states, a discharge blocking signal output terminal (e.g., DO) for switching off the first field effect transistor FET1 in overdischarge state, and a charge blocking signal output terminal (e.g., CO) for switching off the second field effect transistor FET2 in overcharge state.

In this case, the protection IC 120 includes a reference voltage setter, a comparer for comparing a reference voltage and a charge/discharge voltage to each other, an overcurrent detector, and a charge/discharge detector. Herein, reference voltages for determining the charge and discharge states may be changed depending on specifications required by a user, and the charge and discharge states are determined based on the reference voltages by detecting the voltage difference between terminals of the protection IC 120.

The protection IC 120 is configured in such a manner that the terminal DO is changed to LOW state to switch off the first field effect transistor FET1 in overdischarge state, that the terminal CO is changed to LOW state to switch off the second field effect transistor FET2 in overcharge state, and that the second field effect transistor FET2 is switched off when charging and the first field effect transistor FET1 is switched off when discharging in overcurrent state.

The resistor R1 and the capacitor C1 stabilize variations in power supply of the protection IC 120. The resistor R1 is connected between the first node n1 serving as a power (V1) supply node of the battery, and the terminal VDD of the protection IC 120, and the capacitor C1 is connected between the terminal VDD and the terminal VSS of the protection IC 120. Herein, the first node n1 is connected to the first internal connection terminal B+ and the first external connection terminal P+. If the resistor R1 has a high value, when a voltage is detected, the detected voltage is increased due to a current flowing into the protection IC 120. As such, the value of the resistor R1 is set to an appropriate value equal to or less than 1 KΩ. In addition, for stable operation, the capacitor C1 may have an appropriate value equal to or greater than 0.01 µF, for example, 0.1 µF.

The resistors R1 and R2 serve as a current limiter if a charger provides a high voltage exceeding absolute maximum ratings of the protection IC 120 or if the charger is connected with wrong polarity. The resistor R2 is connected between the terminal V− of the protection IC 120 and a second node n2 connected to a source terminal S2 of the second field effect transistor FET2. Since the resistors R1 and R2 are closely related to power consumption, a sum of the values of the resistors R1 and R2 is set to be greater than 1 KΩ. In addition, since recovery may not occur after overcharge blocking if the value of the resistor R2 is excessively large, the value of the resistor R2 is set to a value equal to or less than 10 KΩ. For example, the resistor R1 may have a value of 1 KΩ and the resistor R2 may have a value of 2.2 KΩ.

The capacitor C2 is connected between the second node n2 (or the third external connection terminal P−) and a source terminal S1 of the first field effect transistor FET1 (or the terminal VSS). The capacitor C2 does not exert a strong influence on product features of the battery protection circuit 10, but is added upon a request of the user or for stability. The capacitor C2 is used to achieve system stabilization by improving tolerance to voltage variations or external noise. For stable operation, the capacitor C2 may have a value of, for example, 0.1 μF.

The resistor R3 and the varistor V1 are elements for electrostatic discharge (ESD) and surge protection, and are connected in parallel to each other between the second external connection terminal CF and the second node n2 (or the third external connection terminal P−). The varistor V1 is an element for reducing resistance thereof when overvoltage occurs, and may minimize, for example, circuit damage due to overvoltage.

In some embodiments of the present invention, the battery protection circuit module package is implemented by packaging the battery protection circuit 10 of FIG. 4 which includes the external connection terminals P+, P−, and CF, and the internal connection terminals B+ and B−. For example, the battery protection circuit module package may be implemented by encapsulating and packaging passive elements such as the resistors R1, R2, and R3, the varistor V1, and the capacitors C1 and C2, the protection IC 120, and the dual FET chip 110 using an encapsulant M (see 250 of FIG. 8).

The above-described battery protection circuit 10 according to some embodiments of the present invention is merely an example, and the configuration, number, or position of the protection IC, the FETs, or the passive elements may be appropriately changed depending on the function of the battery protection circuit 10.

Figure 5:
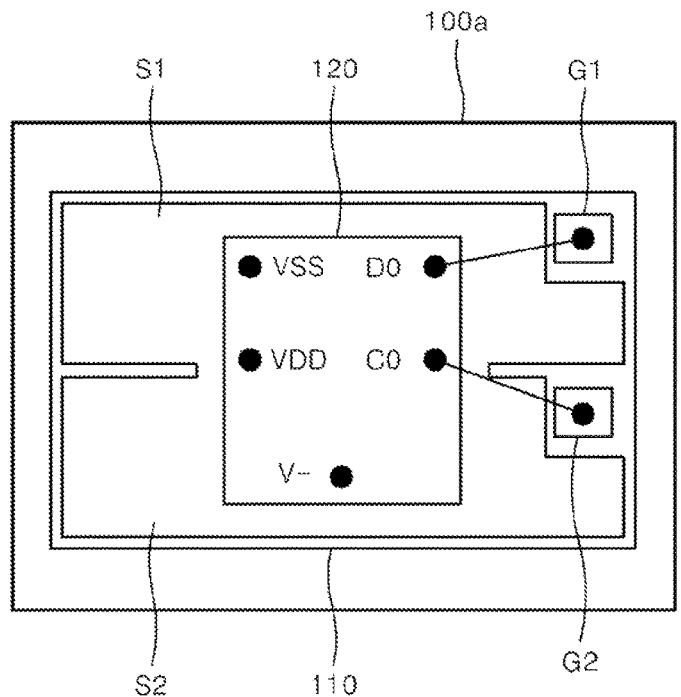
FIG. 5 is a structural view showing the configuration of a multilayer chip for configuring the battery protection circuit module package in the battery pack according to some embodiments of the present invention.

FIG. 5 is a structural view showing the configuration of a multilayer chip 100a for configuring the battery protection circuit module package in the battery pack according to some embodiments of the present invention.

As illustrated in FIG. 5, the dual FET chip 110 and the protection IC 120 are stacked on one another or provided adjacent to each other. For example, the protection IC 120 may be stacked on a top surface of the dual FET chip 110, or the dual FET chip 110 may be provided adjacent to a left or right side of the protection IC 120.

The dual FET chip 110 embeds therein two FETs having a common drain, i.e., the first and second field effect transistors FET1 and FET2, and includes a first gate terminal G1 and a first source terminal S1 of the first field effect transistor FET1 and a second gate terminal G2 and a second source terminal S2 of the second field effect transistor FET2 as external terminals on the top surface of the dual FET chip 110. In addition, a common drain terminal may be provided on a bottom surface of the dual FET chip 110.

The protection IC 120 is stacked on the top surface of the dual FET chip 110. The protection IC 120 is stacked on an area (e.g., a central area) of the dual FET chip 110 other than the area having provided the external terminals thereon. In this case, an insulating layer for insulation may be provided between the protection IC 120 and the dual FET chip 110, and the protection IC 120 and the dual FET chip 110 may be adhered to each other using an insulating adhesive. Since the dual FET chip 110 is generally larger than the protection IC 120, the protection IC 120 is stacked on the dual FET chip 110.

After the protection IC 120 is stacked on the top surface of the dual FET chip 110, the terminal DO of the protection IC 120 is electrically connected to the first gate terminal G1 through wire or wiring, and the terminal CO of the protection IC 120 is electrically connected to the second gate terminal G2 through wire or wiring. A description of connection structures of the other terminals will be given below. The protection IC 120 and the dual FET chip 110 which are stacked on one another as described above may be understood as the multilayer chip 100a.

In the battery protection circuit module package according to some embodiments of the present invention, by employing the multilayer chip 100a in which the protection IC 120 and the dual FET chip 110 are stacked on one another, a mounting area thereof on a lead frame to be described below may be reduced and thus a battery may achieve a small size or a high capacity.

Figure 6:
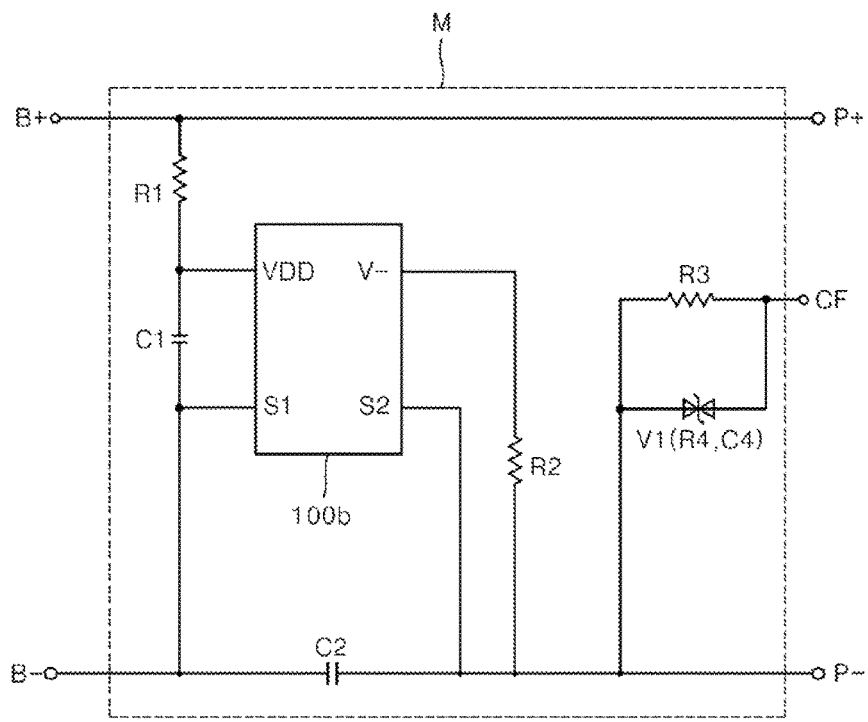
FIG. 6 is a circuit diagram of a modified battery protection circuit to be implemented by the battery protection circuit module package in the battery pack according to some embodiments of the present invention.

FIG. 6 is a circuit diagram of a modified battery protection circuit to be implemented by the battery protection circuit module package in the battery pack according to some embodiments of the present invention. FIG. 6 is a circuit diagram of a battery protection circuit in which first and second FETs and a protection IC are integrated into a single chip, and is an equivalent circuit diagram of FIG. 4.

As illustrated in FIG. 6, if the protection IC 120 and the two common-drain field effect transistors FET1 and FET2 of FIG. 4 are integrated into a flip chip 100b, the circuit may equally perform the operation described above in relation to FIG. 4 and the configuration thereof may be simplified. The flip chip 100b embeds therein the first and second FETs having a common drain and serving as switching elements in overdischarge and overcharge states, and the protection IC for controlling overdischarge and overcharge operations. In addition, since the flip chip 100b is implemented by integrating the multilayer chip 100a including the protection IC 120 and the two common-drain field effect transistors FET1 and FET2 of FIG. 4 into a single chip, the operation or circuit configuration of the flip chip 100b is the same as that of the multilayer chip 100a including the protection IC 120 and the two common-drain field effect transistors FET1 and FET2 of FIG. 4.

As such, the flip chip 100b exposes a voltage application terminal VDD for applying a charge voltage and a discharge voltage, a detection terminal V− for detecting charge and discharge states, a first source terminal S1 serving as a source terminal of the first FET, and a second source terminal S2 serving as a source terminal of the second FET on one surface thereof as external terminals for external connection. The discharge blocking signal output terminal DO or the charge blocking signal output terminal CO of the protection IC 120 of the circuit of FIG. 4 is embedded in the flip chip 100b and thus is not exposed as an external terminal. The external terminals VDD, V−, S1, and S2 have a solder ball structure for external connection and bonding and thus are coupled using flip chip bonding. The positions of the external terminals VDD, V−, S1, and S2 may vary as necessary, and the number of the terminals may be increased or reduced in various ways to improve electrical conductivity or disposition efficiency. For example, the external connection terminals of the flip chip 100b for external connection and bonding may have a 3x3 structure. The voltage application terminal VDD for applying a charge voltage and a discharge voltage, a test terminal TP for a test, and the detection terminal V− for detecting charge and discharge states may be provided in the first row in a three-column structure, the first source terminal S1 may be provided in the second row in a three-column structure, and the second source terminal S2 may be provided in the third row in a three-column structure.

Alternatively, since the external terminals of the flip chip 100b may be soldered and electrically connected to leads, which require electrical connection, without using wire bonding, compared to wire bonding, electrical conductivity may be improved, a production cost may be lowered, and process simplification and volume reduction may be achieved.

Additionally, according to modified embodiments of the present invention, the surge protection circuit configured for electrostatic discharge (ESD) and surge protection may include a resistor R4 or a capacitor C4 instead of the varistor V1. That is, the surge protection circuit may be configured by interconnecting two resistors R3 and R4, one resistor R3 and one capacitor C4, or one resistor R3 and one varistor V1 in parallel.

In the present invention, the battery protection circuit module package may be implemented by packaging the battery protection circuit of FIG. 6, which includes the external connection terminals P+, P−, and CF, and the internal connection terminals B+ and B−. For example, the battery protection circuit module package may be implemented by encapsulating and packaging the passive elements such as the resistors R1, R2, R3, and R4, the varistor V1, and the capacitors C1, C2, and C3, and the flip chip 100b using the encapsulant M.

Figure 7:
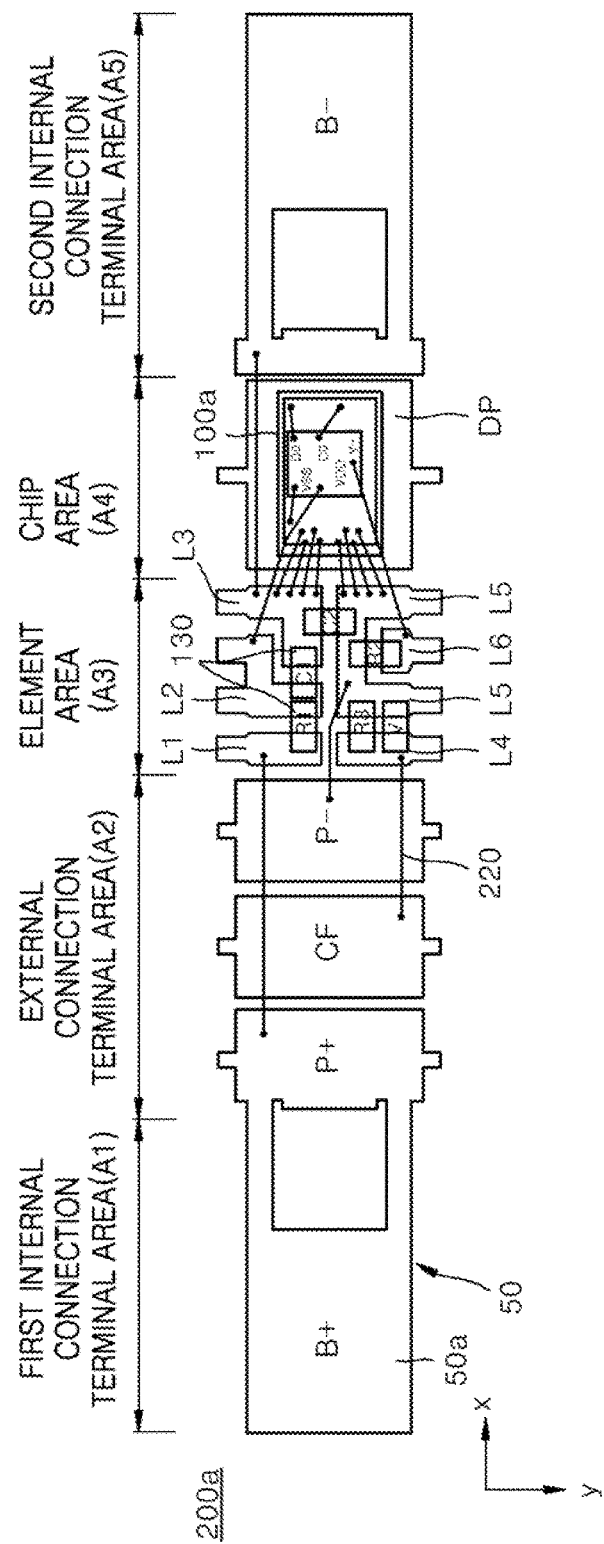
FIG. 7 is a plan view showing the structure of a basic package for configuring the battery protection circuit module package in the battery pack according to some embodiments of the present invention.
Figure 8:
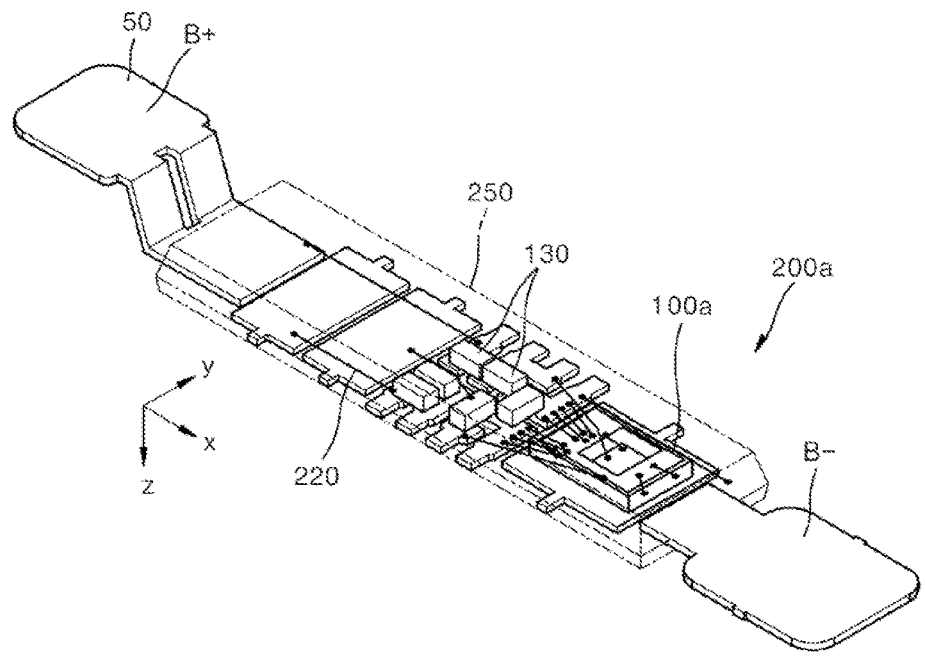
FIG. 8 is a perspective view showing the structure of the basic package for configuring the battery protection circuit module package in the battery pack according to some embodiments of the present invention.

FIGS. 7 and 8 are a plan view and a perspective view showing the structure of a basic package 200a for configuring the battery protection circuit module package in the battery pack according to some embodiments of the present invention.

Referring to FIGS. 7 and 8, the basic package 200a includes the lead frame 50 and protection circuit elements 100a and 130 mounted on the lead frame 50. A top surface 50a of the lead frame 50 is a surface for mounting the protection circuit elements 100a and 130 thereon, and a bottom surface of the lead frame 50 may be a surface opposite to the top surface 50a. A part of the bottom surface of the lead frame 50 corresponding to an external connection terminal area A2 may be entirely or partially plated. A plating material may include at least one selected from the group consisting of gold, silver, nickel, tin, and chromium. The lead frame 50 has a structure in which a first internal connection terminal area A1, the external connection terminal area A2, a protection circuit area including an element area A3 and a chip area A4, and a second internal connection terminal area A5 are sequentially provided. The protection circuit area is provided between the external connection terminal area A2 and the second internal connection terminal area A5, and the order of the element area A3 and the chip area A4 may be changed in various ways.

The first and second internal connection terminal areas A1 and A5 are individually provided at two edges of the package module, and first and second internal connection terminal leads B+ and B− serving as first and second internal connection terminals coupled and electrically connected to the electrodes of the battery core pack 600 are provided thereon, respectively. For example, the first internal connection terminal lead B+ may be coupled to a positive electrode tap of a battery cell, and the second internal connection terminal lead B− may be coupled to a negative electrode tap of the battery cell. However, the polarities of the electrode taps may be switched.

The external connection terminal area A2 is provided adjacent to the first internal connection terminal area A1, and first to third external connection terminal leads P+, CF, and P− serving as a plurality of external connection terminals are sequentially provided thereon. The order of the first to third external connection terminal leads P+, CF, and P− may be changed in various ways. Herein, the first external connection terminal lead P+ and the first internal connection terminal lead B+ are connected to each other. That is, the first internal connection terminal lead B+ may extend from the first external connection terminal lead P+, or the first external connection terminal lead P+ may extend from the first internal connection terminal lead B+. Alternatively, the first internal connection terminal lead B+ may be spaced apart from the first external connection terminal lead P+. Meanwhile, the number, functions, positions, etc. of the leads included in the above-described external connection terminal area A2 may be appropriately changed as necessary.

The element area A3 is used to provide thereon a plurality of passive elements 130 (see R1, R2, R3, C1, C2, C3, and V1 of FIG. 4 or 6) for configuring the battery protection circuit. For example, first to sixth passive element leads L1, L2, L3, L4, L5, and L6 formed of conductive lines may be provided on the element area A3. Specifically, the first to third passive element leads L1, L2, and L3 may be sequentially provided on an upper part of the element area A3, and the fourth to sixth passive element leads L4, L5, and L6 may be sequentially provided on a lower part of the element area A3. The first passive element lead L1 may be provided with a certain size on the element area A3 adjacent to the external connection terminal area A2, and the second passive element lead L2 may be provided adjacent to the first passive element lead L1 with a certain size. The third passive element lead L3 may be provided adjacent to the second passive element lead L2 with a certain size on the element area A3 adjacent to the chip area A4. The fourth passive element lead L4 may be provided with a certain size on the element area A3 adjacent to the external connection terminal area A2, and the fifth and sixth passive element leads L5 and L6 may be provided adjacent to the fourth passive element lead L4 in such a manner that the fifth passive element lead L5 surrounds the sixth passive element lead L6.

As described above, in the element area A3, the lead frame 50 may consist of a plurality of leads spaced apart from each other, and the passive elements 130 may be provided to electrically interconnect at least some of the leads spaced apart from each other. For example, at least one of the passive elements R1, R2, R3, C1, C2, C3, and V1 may be provided over any two of the leads spaced apart from each other.

The chip area A4 is adjacent to the element area A3 and is used provide thereon the protection IC 120 and the dual FET chip 110 for configuring the battery protection circuit. For example, a die pad DP for mounting the multilayer chip 100a or the flip chip 100b thereon may be provided on the chip area A4. The die pad DP may be electrically connected to the common drain terminal of the dual FET chip 110 for configuring the multilayer chip 100a, and may be exposed in a subsequent packaging process to serve as external connection terminals and to improve heat radiation properties. According to modified embodiments of the present invention, the protection IC 120 and the dual FET chip 110 may be individually provided on the chip area A4 to be spaced apart from each other.

Specifically, the multilayer chip 100a may be initially mounted on the die pad DP of the chip area A4, and the reference voltage terminal VSS of the protection IC 120 for configuring the multilayer chip 100a may be electrically connected to a source terminal of the first field effect transistor FET1 or the third passive element lead L3 through wire bonding. The voltage application and battery voltage detection terminal VDD for applying a charge voltage and a discharge voltage in the protection IC 120 may be electrically connected to the second passive element lead L2 through, for example, a bonding wire 220, and the detection terminal V− for detecting charge/discharge and overcurrent states in the protection IC 120 may be electrically connected to the sixth passive element lead L6 through a bonding wire 220. The source terminal S1 of the first field effect transistor FET1 may be electrically connected to the third passive element lead L3 through, for example, a bonding wire 220, and the source terminal S2 of the second field effect transistor FET2 may be electrically connected to the fifth passive element lead L5 through, for example, a bonding wire 220. Then, the first passive element lead L1 and the first external connection terminal lead P+ may be electrically connected to each other through, for example, a bonding wire 220, and the third passive element lead L3 and the second internal connection terminal lead B− may be electrically connected to each other through, for example, a bonding wire 220. The fourth passive element lead L4 may be electrically connected to the second external connection terminal lead CF through a bonding wire 220, and the fifth passive element lead L5 may be electrically connected to the third external connection terminal lead L3 through a bonding wire 220. Among the passive elements R1, R2, R3, V1, C1, and C2, the first resistor R1 may be provided between the first and second passive element leads L1 and L2, and the second resistor R2 may be provided between the fifth and sixth passive element leads L5 and L6. Among the passive elements R1, R2, R3, V1, C1, and C2, the third resistor R3 for configuring a surge protection circuit may be provided between the fourth and fifth passive element leads L4 and L5, the first capacitor C1 may be provided between the second and third passive element leads L2 and L3, and the second capacitor C2 may be provided between the third and fifth passive element leads L3 and L5. Among the passive elements R1, R2, R3, V1, C1, and C2, the varistor V1 for configuring the surge protection circuit may be provided between the fourth and fifth passive element leads L4 and L5 in parallel to the third resistor R3.

The basic package 200a for implementing the battery protection circuit having the above-described configuration may be understood as a structure before the encapsulant 250 is provided, and may be molded with the encapsulant 250 thereafter to implement the battery protection circuit module package 300. That is, the encapsulant 250 may be provided on the basic package 200a illustrated in FIG. 8 to encapsulate the protection circuit elements 100a, 100b, and 130 and to expose the first and second internal connection terminal leads B+ and B− of the lead frame 50, thereby implementing the battery protection circuit module package 300.

The lead frame 50 may consist of a plurality of leads spaced apart from each other. The passive elements 130 may be provided to interconnect at least some of the leads spaced apart from each other. The multilayer chip 100a or the flip chip 100b including the protection IC and the FETs may also be provided to interconnect at least some of the leads spaced apart from each other. Furthermore, an electrical connection member 220 may electrically interconnect any two selected from the group consisting of the protection IC, the FETs (e.g., the multilayer chip 100a or the flip chip 100b including the protection IC and the FETs), and the leads. The electrical connection member 220 may include bonding wire or bonding ribbon. As such, the battery protection circuit module package according to some embodiments of the present invention may configure a battery protection circuit without using a printed circuit board (PCB).

Although the battery protection circuit module package 300 according to some embodiments of the present invention includes the lead frame 50 having a plurality of mounting leads spaced apart from each other, since a battery protection circuit is configured by providing the electrical connection member 220 such as bonding wire or bonding ribbon on the lead frame 50, a process for designing and manufacturing the lead frame 50 for configuring the battery protection circuit may be simplified. If the electrical connection member 220 is not employed to configure the battery protection circuit in some embodiments of the present invention, the configuration of the leads of the lead frame 50 may be very complicated and thus the lead frame 50 may not be appropriately and efficiently provided.

In the battery protection circuit module package 300 according to some embodiments of the present invention, a protection IC chip, an FET chip, or the multilayer chip 100a or the flip chip 100b including the protection IC and the FETs may not be inserted and fixed into the lead frame 50 in the form of a semiconductor package but may be mounted and fixed onto at least a part of the surface of the lead frame 50 using surface mounting technology in the form of a chip die not encapsulated with an encapsulant but sawed on a wafer. Herein, the chip die refers to an individual structure not encapsulated with an encapsulant but implemented by performing a sawing process on a wafer having an array of a plurality of structures (e.g., the protection IC chip and the FET chip) thereon. That is, when at least one selected from the group consisting of the protection IC chip, the FET chip, and the multilayer chip 100a or the flip chip 100b including the protection IC and the FETs is mounted on the lead frame 50, since the protection IC chip, the FET chip, or the multilayer chip 100a or the flip chip 100b including the protection IC and the FETs is mounted in non-encapsulated state and then is encapsulated with the encapsulant 250, only one encapsulation process is necessary to implement the battery protection circuit module package 300. On the contrary, when the protection IC chip, the FET chip, or the multilayer chip 100a or the flip chip 100b including the protection IC and the FETs is inserted and fixed or mounted into a PCB, since each component initially requires a molding process and then additionally requires another molding process after being fixed or mounted into the PCB, a manufacturing process is complicated and a manufacturing cost is high.

The above-described basic package 200a is a result of performing operation S110 illustrated in FIG. 3. A description is now given of operations S120 and S130 illustrated in FIG. 3. In a battery protection circuit module package according to modified embodiments of the present invention, a battery protection circuit may be configured using a PCB, and the technical idea of the present invention may also be applied to operations S120 and S130 in the above modified configuration.

Figure 9:
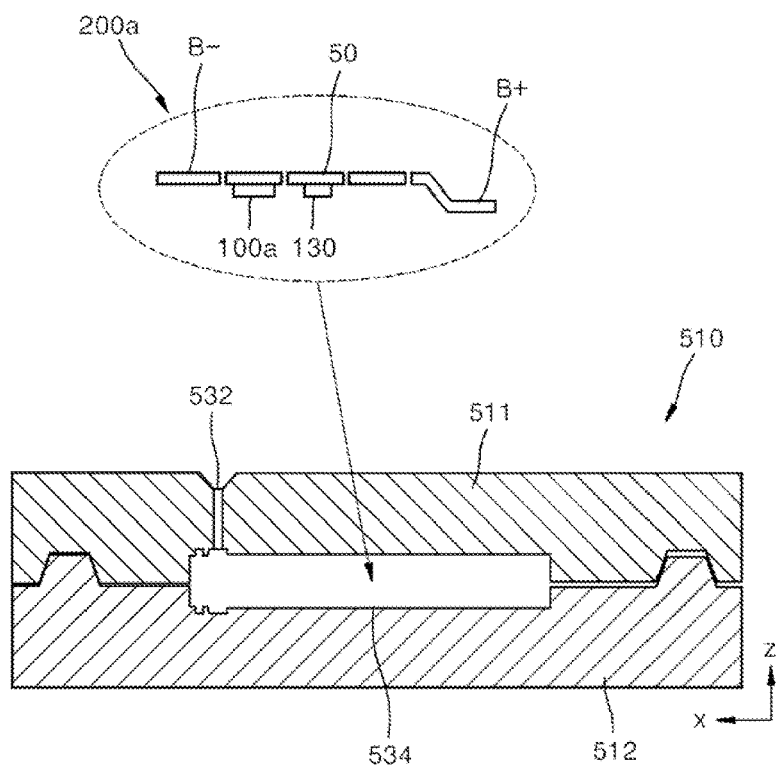
FIG. 9 is a conceptual view showing that the basic package for configuring the battery protection circuit module package is disposed in an injection mold in the battery pack according to some embodiments of the present invention.
Figure 10:
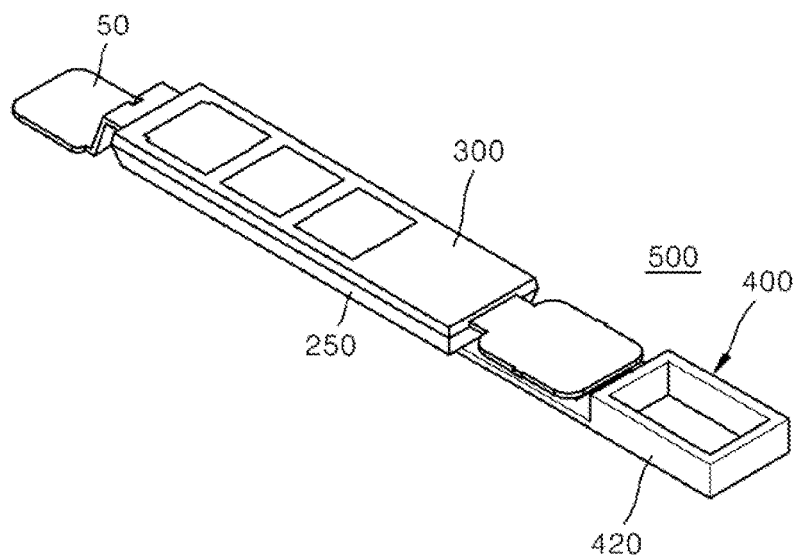
FIG. 10 is a perspective view of a structure of the battery protection circuit module package coupled with a holder in the battery pack according to some embodiments of the present invention.

FIG. 9 is a conceptual view showing that the basic package 200a for configuring the battery protection circuit module package 300 is disposed in an injection mold in the battery pack according to some embodiments of the present invention, and FIG. 10 is a perspective view of the structure 500 of the battery protection circuit module package 300 coupled with the holder 400 in the battery pack according to some embodiments of the present invention.

Referring to FIG. 9, the basic package 200a is disposed in a first injection mold 510. The basic package 200a may include, for example, the lead frame 50 consisting of a plurality of leads spaced apart from each other, and the protection circuit elements 100a and 130 provided on the lead frame 50 as described above. The first injection mold 510 includes an upper mold 511 and a lower mold 512, and a molding space 534 for injection molding is provided between the upper and lower molds 511 and 512. An injection hole 532 connected to the molding space 534 and used to inject a melt of resin therethrough may be provided in the upper mold 511. The shape of the molding space 534 illustrated in FIG. 9 is merely an example, and may be appropriately changed depending on the shapes of the encapsulant 250 and the holder 400 to be implemented.

In some embodiments of the present invention, the holder 400 and the encapsulant 250 illustrated in FIG. 10 may be simultaneously produced by disposing the basic package 200a in the first injection mold 510 and injecting a melt of resin into the first injection mold 510 to perform an insert injection molding process. That is, the holder 400 and the encapsulant 250 may be formed of the same resin and may be simultaneously produced using a single process. The encapsulant 250 encapsulates the protection circuit elements 100a and 130 to expose parts of the lead frame 50, and the encapsulant 250 and the basic package 200a configure the battery protection circuit module package 300. Meanwhile, the holder 400 may be coupled to the battery protection circuit module package 300 due to the insert injection molding process to implement the structure 500. For example, the holder 400 may be coupled to the encapsulant 250 and/or the lead frame 50 due to the insert injection molding process to implement the structure 500. According to some embodiments of the present invention, since the encapsulant 250 and the holder 400 are simultaneously produced using a single process, a manufacturing process may be simplified. In addition, since the holder 400 is coupled to the battery protection circuit module package 300 due to the insert injection molding process, a coupling force therebetween may be remarkably increased.

Figure 11:
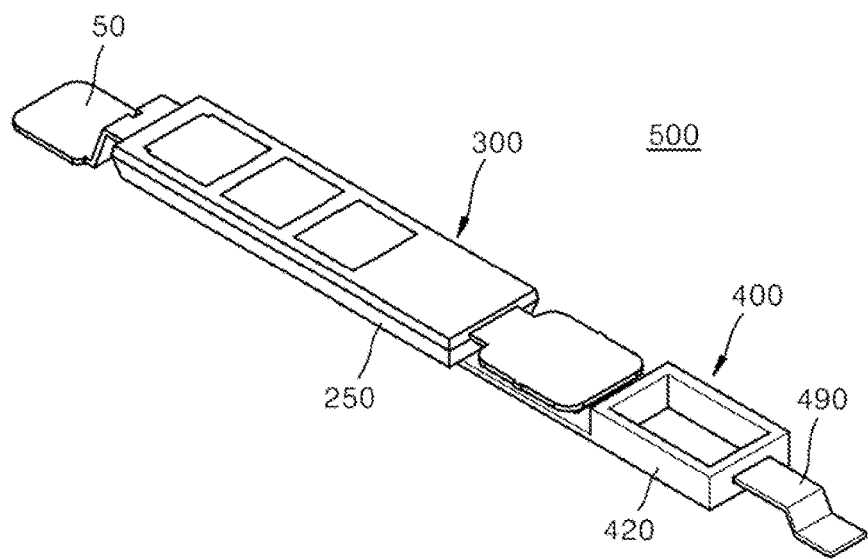
FIG. 11 is a perspective view showing a modified structure of the battery protection circuit module package coupled with the holder in the battery pack according to some embodiments of the present invention.

FIG. 11 is a perspective view showing a modified structure 500 of the battery protection circuit module package 300 coupled with the holder 400 in the battery pack according to some embodiments of the present invention.

Referring to FIG. 11, in the structure 500 of the battery protection circuit module package 300 coupled with the holder 400, the holder 400 may include a fixing plate 490 formed of metal, e.g., nickel. One end of the fixing plate 490 is buried and fixed by the body 420 of the holder 400, and another end of the fixing plate 490 protrudes and extends from the body 420. The other end of the fixing plate 490 may be coupled and fixed to the top surface 640 of the battery core pack 600, and a coupling method thereof may include, for example, laser welding or resistance welding. If necessary, the fixing plate 490 may have a shape bent in the form of a gull. To implement the structure 500 illustrated in FIG. 11, the basic package 200a and the fixing plate 490 may be disposed in the first injection mold 510 illustrated in FIG. 9 and then a melt of resin may be injected to perform an insert injection molding process. A part of the fixing plate 490 is coupled to the top surface 640 of the battery core pack 600 in a subsequent process. As such, the structure 500 of the battery protection circuit module package 300 coupled with the holder 400 may be prevented from being distorted at the top surface 640 of the battery core pack 600 due to an external force. That is, since the other end of the fixing plate 490 is firmly fixable to the top surface 640 of the battery core pack 600 using, for example, welding, the structure 500 of the battery protection circuit module package 300 coupled with the holder 400 may be prevented from being distorted at the top surface 640 of the battery core pack 600.

Figure 12:
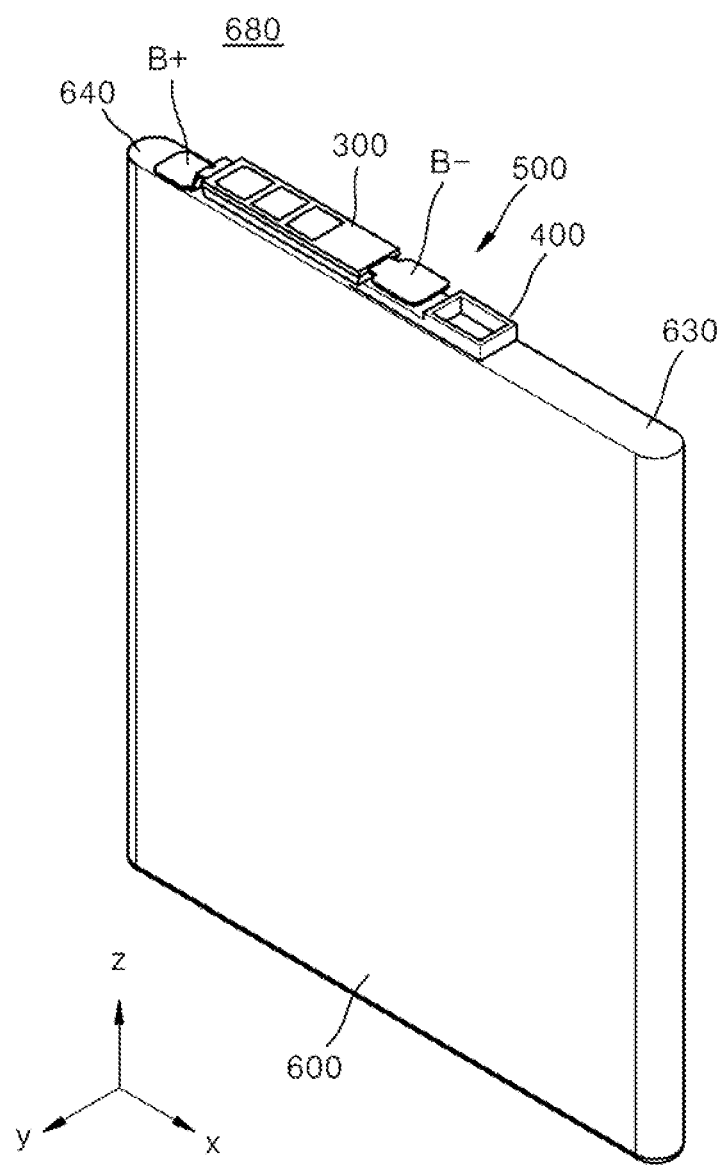
FIG. 12 is a perspective view showing an example that the structure of the battery protection circuit module package coupled with the holder is coupled to a battery core pack in the battery pack according to some embodiments of the present invention.
Figure 13:
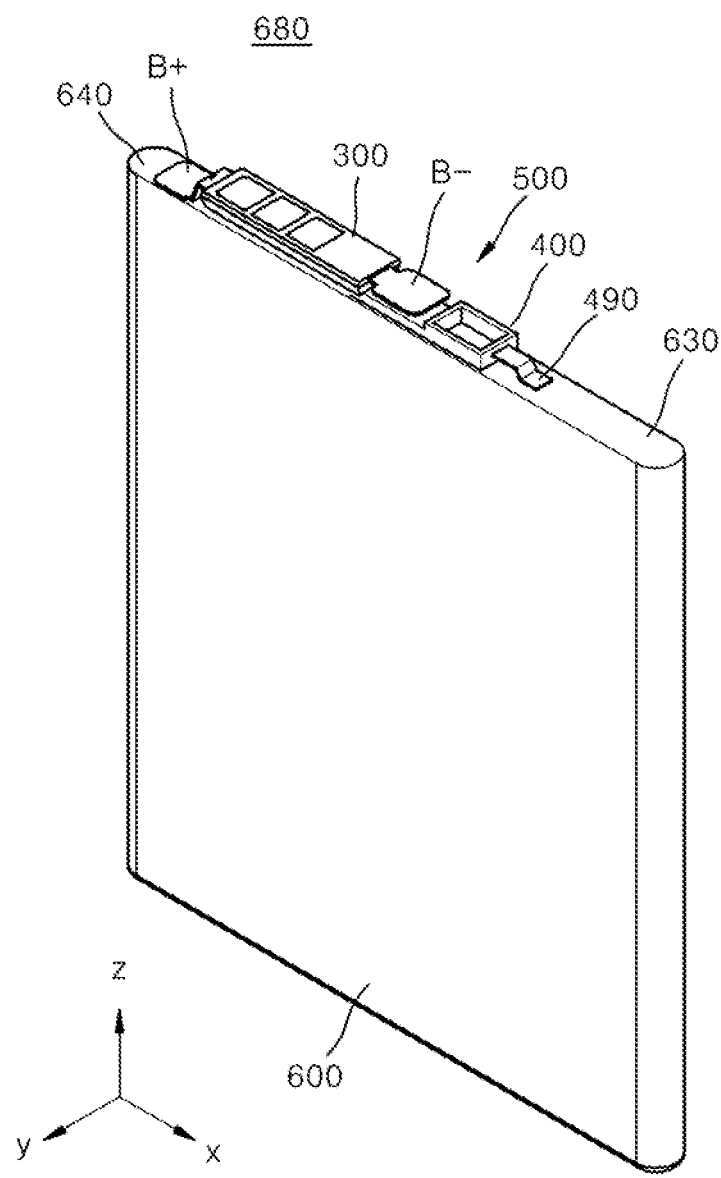
FIG. 13 is a perspective view showing a modified example that the structure of the battery protection circuit module package coupled with the holder is coupled to the battery core pack in the battery pack according to some embodiments of the present invention.
Figure 14:
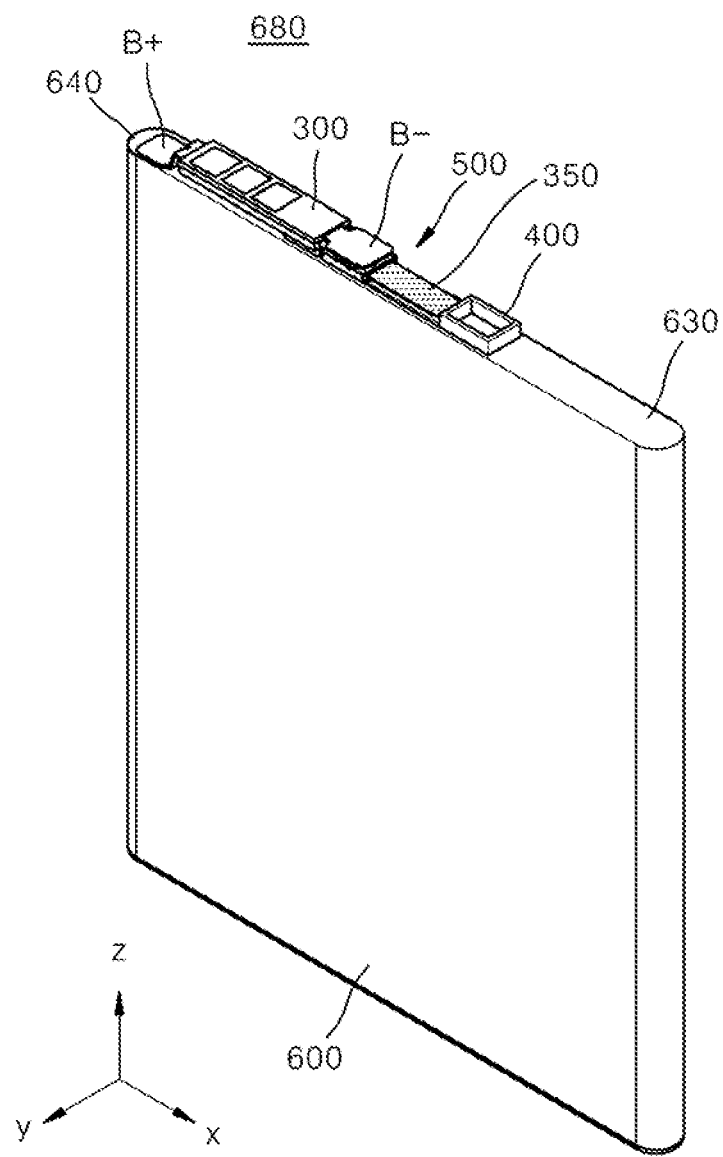
FIG. 14 is a perspective view showing another modified example that the structure of the battery protection circuit module package coupled with the holder is coupled to the battery core pack in the battery pack according to some embodiments of the present invention.

FIGS. 12 to 14 are perspective views showing examples that the structure 500 of the battery protection circuit module package 300 coupled with the holder 400 is coupled to the battery core pack 600 in the battery pack according to some embodiments of the present invention.

In operation S140 for coupling the battery core pack 600 with the structure 500 of the battery protection circuit module package 300 coupled with the holder 400, a coupling method thereof may use at least one selected from the group consisting of laser welding, resistance welding, soldering, a conductive adhesive, and conductive tape.

The structure 500 of the battery protection circuit module package 300 coupled with the holder 400 illustrated in FIG. 10 is applied to an assembly 680 having the battery core pack 600 coupled with the structure 500 in FIG. 12, and the structure 500 of the battery protection circuit module package 300 coupled with the holder 400 illustrated in FIG. 11 is applied to an assembly 680 having the battery core pack 600 coupled with the structure 500 in FIG. 13. Meanwhile, in an assembly 680 of FIG. 14, a positive temperature coefficient (PTC) 350 is added to one end of the battery protection circuit module package 300 in the structure 500 of the battery protection circuit module package 300 coupled with the holder 400.

Figure 15:
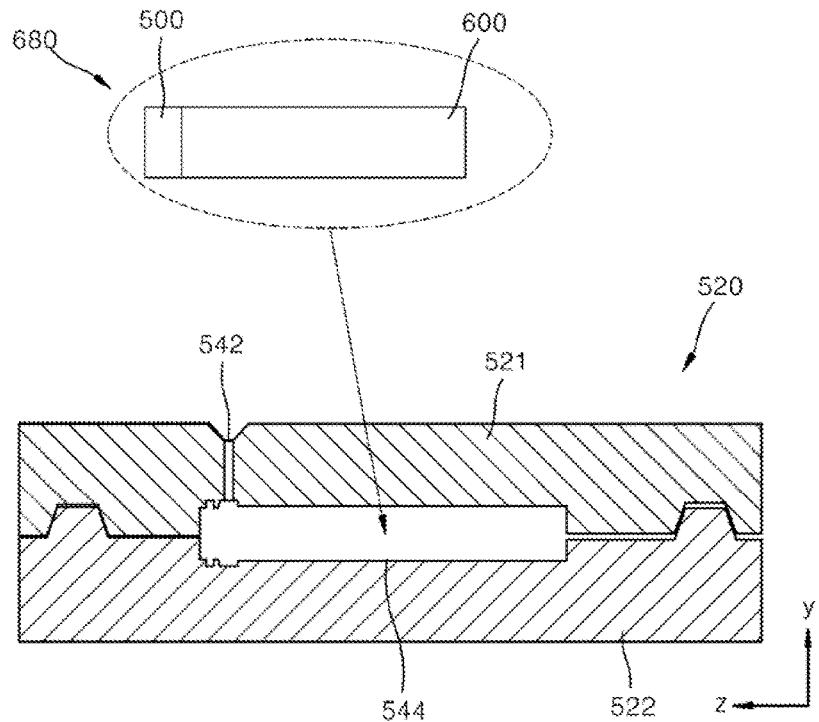
FIG. 15 is a conceptual view showing that the battery core pack coupled with the structure of the battery protection circuit module package coupled with the holder is disposed in an injection mold in the method of manufacturing the battery pack, according to some embodiments of the present invention.

Lastly, operation S150 for casing the upper part of the battery core pack 600 with the upper case 700 to embed the structure 500 therein may be understood with reference to FIG. 15.

Referring to FIG. 15, the assembly 680 having the battery core pack 600 coupled with the structure 500 is disposed in a second injection mold 520. The second injection mold 520 includes an upper mold 521 and a lower mold 522, and a molding space 544 for injection molding is provided between the upper and lower molds 521 and 522. An injection hole 542 connected to the molding space 544 and used to inject a melt of resin therethrough may be provided in the upper mold 521. The shape of the molding space 544 illustrated in FIG. 15 is merely an example, and may be appropriately changed depending on the shape of the upper case 700 to be implemented.

In some embodiments of the present invention, the upper case 700 coupled to at least a part of one selected among the structure 500 and the battery core pack 600 illustrated in FIGS. 1 and 2 may be implemented by disposing the assembly 680 having the battery core pack 600 coupled to the structure 500, in the second injection mold 520 and injecting a melt of resin into the second injection mold 520 to perform an insert injection molding process. For example, the upper case 700 may be coupled to the structure 500 of the battery protection circuit module package 300 coupled with the holder 400, and/or the battery core pack 600 using an insert injection molding process. Since the upper case 700 is molded due to the insert injection molding process, a coupling force of the upper case 700 may be remarkably increased.

According to modified embodiments of the present invention, in operation S150 for casing the upper part of the battery core pack 600 with the upper case 700 to embed the structure 500 therein, a preliminarily produced upper case 700 may be coupled to the upper part of the battery core pack 600 using a variety of coupling methods, e.g., assembling, welding, and/or an adhesive. In this case, the upper case 700 may be formed of at least one selected from the group consisting of resin, metal, ceramic, and a combination thereof. This method differs from the method of producing the upper case 700 by disposing the battery core pack 600 having the structure 500 coupled to the top surface 640 thereof, in a second injection mold, and injecting a melt of resin into the second injection mold to perform a second insert injection molding process. Since the upper case 700 is coupled using a simple casing process without using the second injection mold, a manufacturing cost may be reduced.

Second Embodiment Group

Figure 16:
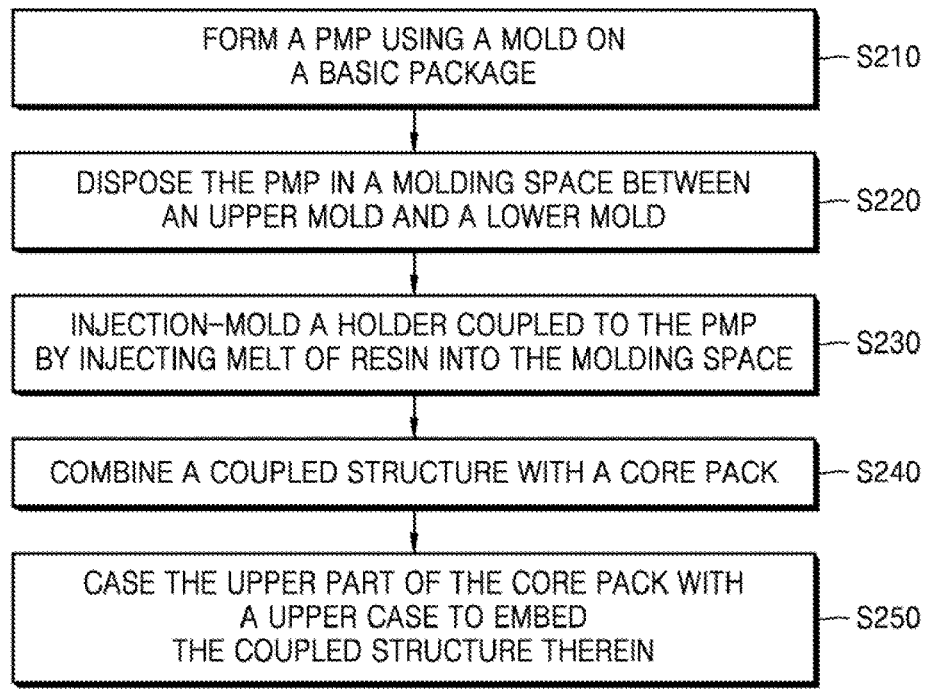
FIG. 16 is a flowchart of a method of manufacturing a battery pack, according to other embodiments of the present invention.
Figure 17:
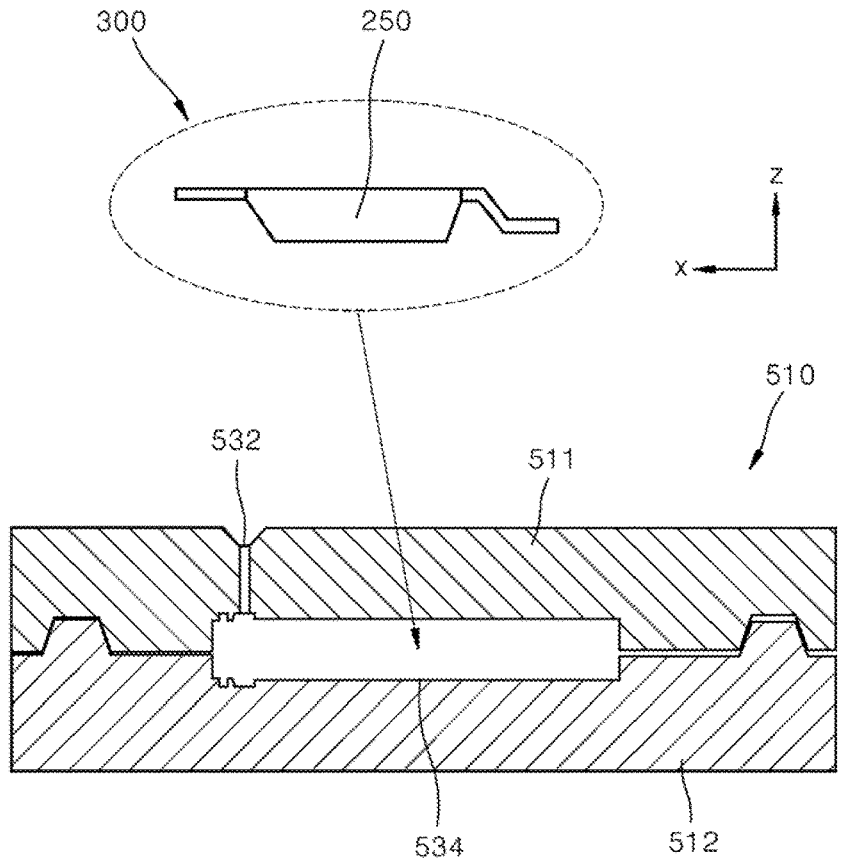
FIG. 17 is a conceptual view showing that a battery protection circuit module package is disposed in an injection mold in the method of manufacturing the battery pack, according to other embodiments of the present invention.

FIG. 16 is a flowchart of a method of manufacturing a battery pack, according to other embodiments of the present invention, and FIG. 17 is a conceptual view showing that a battery protection circuit module package is disposed in an injection mold in the method of manufacturing the battery pack, according to other embodiments of the present invention.

Referring to FIG. 16, a method of manufacturing a structure of a battery protection circuit module package coupled with a holder includes providing a battery protection circuit module package including a lead frame consisting of a plurality of leads spaced apart from each other, protection circuit elements provided on the lead frame, and an encapsulant (or a molded material) for encapsulating the protection circuit elements (S210), disposing the battery protection circuit module package in a first injection mold (S220), and producing a holder coupled to the battery protection circuit module package by injecting a melt of resin into the first injection mold and performing an insert injection molding process, to provide a structure of the battery protection circuit module package coupled with the holder (S230). Subsequently, the method further includes coupling a battery core pack with the structure (S240), and casing an upper part of the battery core pack with an upper case to embed the structure therein (S250).

The structure of the battery protection circuit module package coupled with the holder is implemented by sequentially performing operations S210, S220, and S230, and a description of the battery protection circuit module package is almost the same as that given above according to the first embodiment group.

The battery protection circuit module package 300 is a result of performing operation S210 illustrated in FIG. 16, and a description is now given of operations S220 and S230 illustrated in FIG. 16.

Referring to FIG. 17, the battery protection circuit module package 300 having the encapsulant 250 provided thereon is disposed in the first injection mold 510. The battery protection circuit module package 300 may include, for example, the lead frame 50 consisting of a plurality of leads spaced apart from each other, the protection circuit elements 100a and 130 provided on the lead frame 50, and the encapsulant 250 as described above. The first injection mold 510 includes the upper mold 511 and the lower mold 512, and the molding space 534 for injection molding is provided between the upper and lower molds 511 and 512. The injection hole 532 connected to the molding space 534 and used to inject the melt of the resin therethrough may be provided in the upper mold 511. The shape of the molding space 534 illustrated in FIG. 17 is merely an example, and may be appropriately changed depending on the shape of the holder 400 to be implemented.

In other embodiments of the present invention, the holder 400 may be produced as illustrated in FIG. 10 by disposing the battery protection circuit module package 300 in the first injection mold 510 and injecting the melt of the resin into the first injection mold 510 to perform an insert injection molding process. The holder 400 may implement the structure 500 coupled to the battery protection circuit module package 300 due to the insert injection molding process. For example, the holder 400 may implement the structure 500 coupled to the encapsulant 250 and/or the lead frame 50 due to the insert injection molding process. According to some embodiments of the present invention, since the holder 400 is coupled to the battery protection circuit module package 300 due to the insert injection molding process, a coupling force therebetween may be remarkably increased. Meanwhile, since a terminal member disposed in the molding space 534 in the insert injection molding process is not the basic package 200a having elements spaced apart from each other but the battery protection circuit module package 300 having elements integrated with each other, motion of the terminal member during the melt of the resin is injected into the molding space 534 may be minimized and thus the degree of precision of a product may be improved.

Descriptions of the battery protection circuit module package 300, the holder 400, the structure 500, the assembly 680, the battery pack 800, and others according to the second embodiment group are the same as those given above in relation to FIGS. 1, 2, 4 to 8, and 10 to 15 according to the first embodiment group, and thus are not given herein. For example, the configuration of the structure 500 described above in relation to FIGS. 10 and 11 may be applied to the structure 500 according to the second embodiment group, and the configuration of the assembly 680 described above in relation to FIGS. 12 to 14 may be applied to the assembly 680 according to the second embodiment group.

Third Embodiment Group

Figure 18:
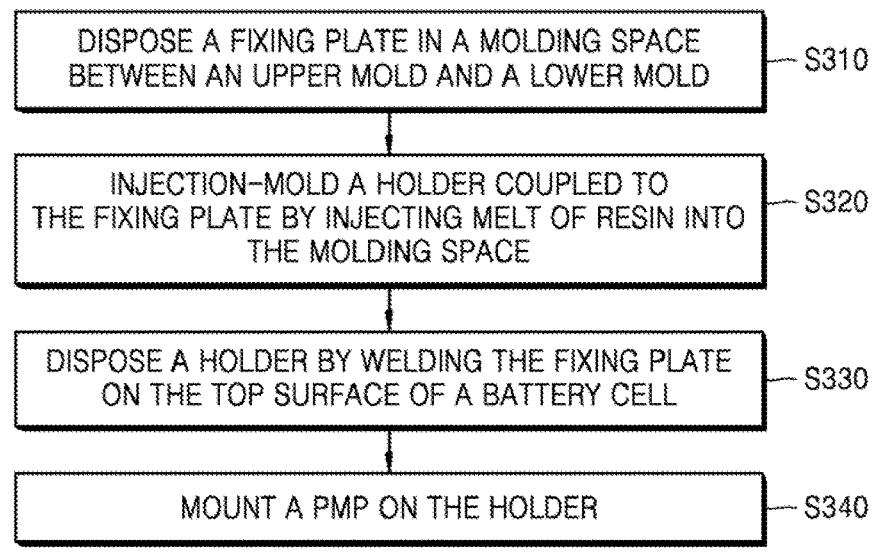
FIG. 18 is a flowchart of a method of manufacturing a holder capable of mounting a battery protection circuit module package thereon and a method of manufacturing a battery pack using the same, according to still other embodiments of the present invention.
Figure 19:
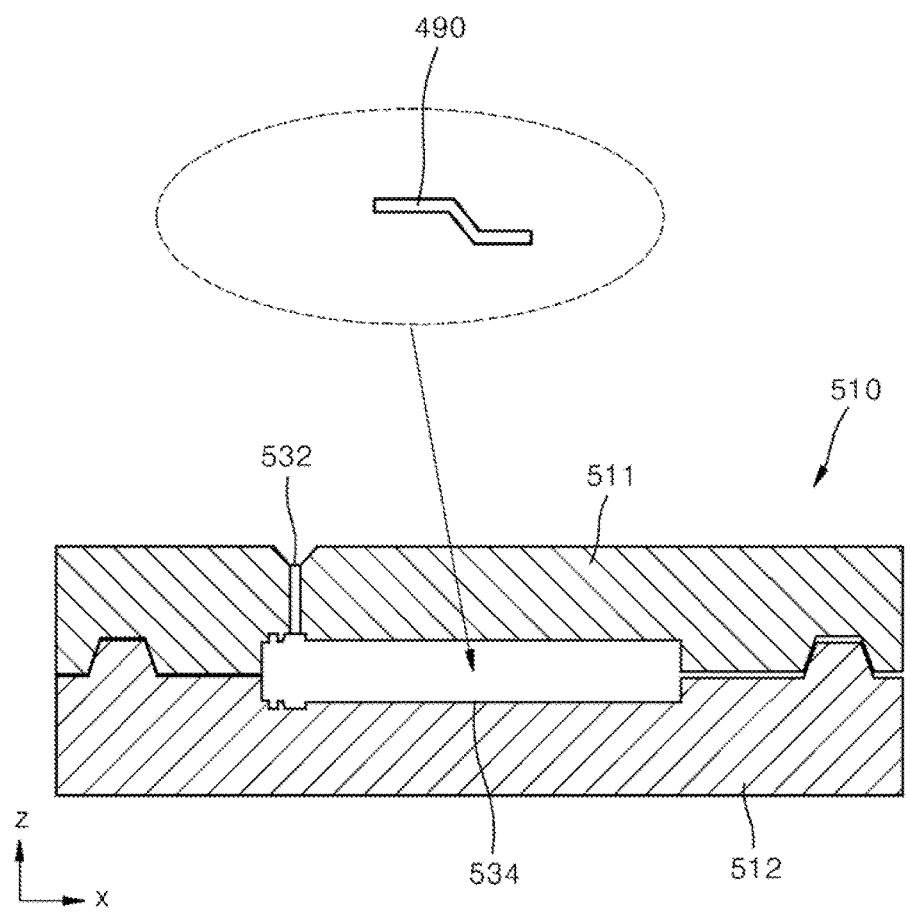
FIG. 19 is a conceptual view showing that a fixing plate is disposed in an injection mold in the method of manufacturing the holder capable of mounting the battery protection circuit module package thereon, according to still other embodiments of the present invention.
Figure 20:
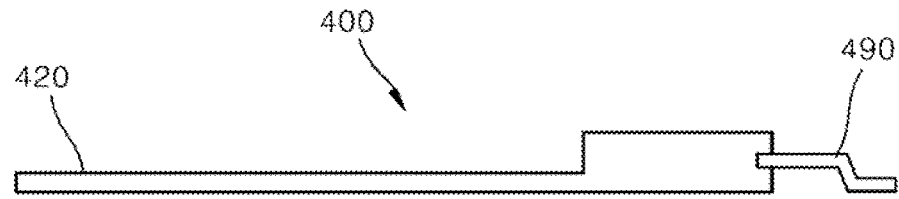
FIG. 20 includes a side view, a plan view, and a perspective view of the holder capable of mounting the battery protection circuit module package thereon, according to still other embodiments of the present invention.
Figure 20:
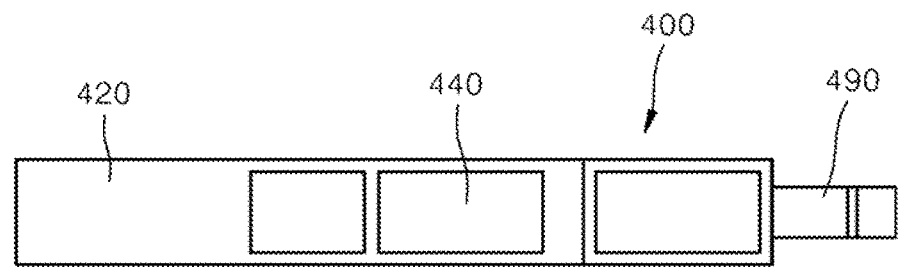
Figure 20:
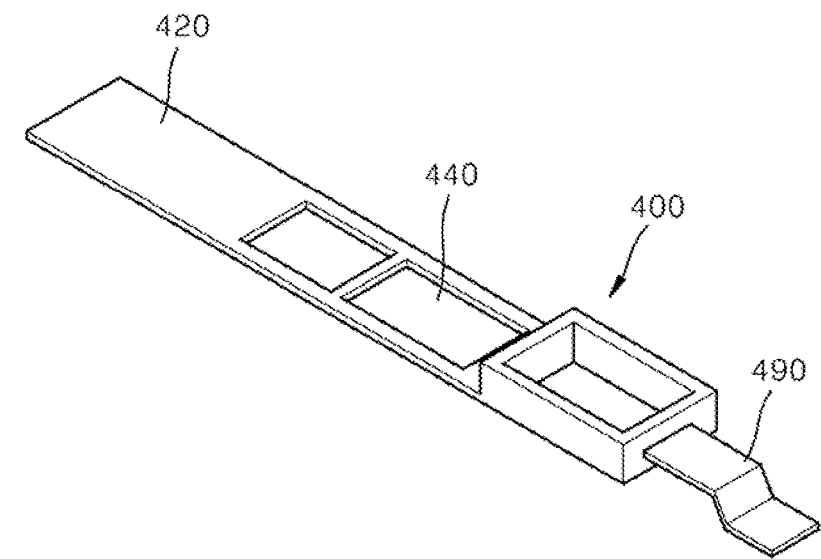

FIG. 18 is a flowchart of a method of manufacturing a holder 400 capable of mounting a battery protection circuit module package 300 thereon and a method of manufacturing a battery pack using the same, according to still other embodiments of the present invention, FIG. 19 is a conceptual view showing that a fixing plate 490 is disposed in an injection mold 510 in the method of manufacturing the holder 400 capable of mounting the battery protection circuit module package 300 thereon, according to still other embodiments of the present invention, and FIG. 20 includes a side view, a plan view, and a perspective view of the holder 400 capable of mounting the battery protection circuit module package 300 thereon, according to still other embodiments of the present invention.

Referring to FIGS. 18 and 19, the method of manufacturing the holder 400 capable of mounting the battery protection circuit module package 300 thereon, according to still other embodiments of the present invention includes disposing the fixing plate 490 formed of metal, in the injection mold 510 (S310), and producing a body 420 capable of burying and fixing one end of the fixing plate 490 and supporting the battery protection circuit module package 300, by injecting a melt of resin into the injection mold 510 to perform an insert injection molding process (S320).

Referring to FIG. 18, in operation S310 for disposing the fixing plate 490 formed of metal, in the injection mold 510, the injection mold 510 includes an upper mold 511 and a lower mold 512, and a molding space 534 for injection molding is provided between the upper and lower molds 511 and 512. An injection hole 532 connected to the molding space 534 and used to inject the melt of the resin therethrough may be provided in the upper mold 511. The shape of the molding space 534 illustrated in FIG. 19 is merely an example, and may be appropriately changed depending on the shape of the holder 400 to be implemented. Referring to FIGS. 19 and 20, one end of the fixing plate 490 is buried and fixed by the body 420 produced by disposing the fixing plate 490 in the injection mold 510 and injecting the melt of the resin to produce the body 420 through insert injection molding. If necessary, the fixing plate 490 may have a shape bent in the form of a gull.

For convenience, the fixing plate 490 is provided at only a side of the body 420 in FIG. 20. However, if necessary, the fixing plate 490 may also be provided at other sides of the body 420. For example, one fixing plate 490 may be provided at each of four sides of the body 420 and thus the holder 400 including a total of four fixing plates 490 may be implemented.

Subsequently, the method of manufacturing the battery pack, according to still other embodiments of the present invention includes fixing the holder 400 to a battery core pack 600 by coupling the fixing plate 490 to a top surface 640 of the battery core pack 600 (S330), and mounting the battery protection circuit module package 300 on the holder 400 (S340).

The process for coupling the fixing plate 490 to the top surface 640 of the battery core pack 600 may include at least one selected from the group consisting of, for example, laser welding, resistance welding, soldering, a conductive adhesive, and conductive tape. Since the fixing plate 490 is coupled, the body 420 of the holder 400 may be prevented from being distorted at the top surface 640 of the battery core pack 600. That is, since another end of the fixing plate 490 is firmly fixable to the top surface 640 of the battery core pack 600 using, for example, welding, the holder 400 may be prevented from being distorted at the top surface 640 of the battery core pack 600. Furthermore, in the process for mounting the battery protection circuit module package 300 on the holder 400, the battery protection circuit module package 300 may be accurately aligned and mounted on the top surface 640 of the battery core pack 600.

In the third embodiment group, other descriptions of the battery protection circuit module package 300 and the holder 400 are the same as those given above in relation to FIGS. 1, 2, and 4 to 8 according to the first embodiment group, and thus are not given herein.

While the present invention has been particularly shown and described with reference to embodiments thereof, it will be understood by those of ordinary skill in the art that various changes in form and details may be made therein without departing from the spirit and scope of the present invention as defined by the following claims.

The invention claimed is:

1. A structure of a battery protection circuit module package coupled with a holder, the structure comprising:
   a basic package comprising a lead frame consisting of a plurality of leads spaced apart from each other, and protection circuit elements provided on the lead frame without use of a printed circuit board; and
   an encapsulant and a holder simultaneously produced by disposing the basic package in a first injection mold and injecting a melt of resin into the first injection mold to perform an insert injection molding process,
   wherein the encapsulant encapsulates the protection circuit elements to expose part of the lead frame,
   wherein the encapsulant and the basic package configure the battery protection circuit module package, and
   wherein the holder is coupled to the battery protection circuit module package by the insert injection molding process.

2. The structure of claim 1, wherein the lead frame comprises:
   a first internal connection terminal lead and a second internal connection terminal lead provided at two ends of the lead frame, exposed by the encapsulant, and electrically connectable to electrodes of a battery core pack;
   external connection terminal leads provided between the first and second internal connection terminal leads and serving as a plurality of external connection terminals; and
   element mounting leads provided between the first and second internal connection terminal leads and used to mount the protection circuit elements thereon.

3. The structure of claim 1, wherein the protection circuit elements comprise a protection integrated chip (IC), a field effect transistor (FET), and one or more passive elements, and
   wherein the passive elements are provided to interconnect at least some of the leads spaced apart from each other, and further comprise an electrical connection member for electrically interconnecting any two selected from the group consisting of the protection IC, the FET, and the leads, thereby configuring a battery protection circuit without using a printed circuit board (PCB).

4. The structure of claim 3, wherein the electrical connection member comprises bonding wire or bonding ribbon.

5. The structure of claim 3, wherein the protection IC and the FET are not inserted and fixed into the lead frame in a form of a semiconductor package but are mounted and fixed onto at least parts of a surface of the lead frame using surface mounting technology in a form of a chip die not encapsulated with an encapsulant.

6. The structure of claim 1, wherein the holder comprises a body formed of the resin, and one or more through holes provided in the body, and
   wherein parts of the battery protection circuit module package are capable of being coupled and electrically connected to electrodes of a battery core pack through the through holes.

7. The structure of claim 6, wherein the holder further comprises a fixing plate formed of metal and having one end buried and fixed by the body and another end protruding and extending from the body to be coupled and fixed to a top surface of the battery core pack.

8. A battery pack comprising:
   the structure of claim 1;
   a battery core pack coupled with the structure; and
   an upper case for casing an upper part of the battery core pack to embed the structure therein.

9. The battery pack of claim 8, wherein the upper case is produced to be coupled to at least a part of one selected among the structure and the battery core pack, by disposing the structure and the battery core pack in a second injection mold and injecting a melt of resin into the second injection mold to perform an insert injection molding process.

10. The battery pack of claim 8, wherein the upper case is coupled to the upper part of the battery core pack using assembling, welding, or an adhesive.

11. The battery pack of claim 8, wherein the structure is coupled to the battery core pack using at least one selected from the group consisting of laser welding, resistance welding, soldering, a conductive adhesive, and conductive tape.

12. A structure of a battery protection circuit module package coupled with a holder, wherein the battery protection circuit module package comprises a lead frame consisting of a plurality of leads spaced apart from each other, protection circuit elements provided on the lead frame without use of a printed circuit board, and an encapsulant for encapsulating the protection circuit elements; and wherein the holder is coupled to the battery protection circuit module package by disposing the battery protection circuit module package in a first injection mold and injecting a melt of resin to perform an insert injection molding process.

* * * * *